(12) United States Patent
Fujiu

(10) Patent No.: US 9,164,893 B2
(45) Date of Patent: Oct. 20, 2015

(54) NONVOLATILE SEMICONDUCTOR MEMORY DEVICE

(71) Applicant: KABUSHIKI KAISHA TOSHIBA, Tokyo (JP)

(72) Inventor: Masaki Fujiu, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 14/017,249

(22) Filed: Sep. 3, 2013

(65) Prior Publication Data

US 2014/0082266 A1  Mar. 20, 2014

(30) Foreign Application Priority Data

Sep. 18, 2012 (JP) ................................. 2012-205059

(51) Int. Cl.
G11C 11/34 (2006.01)
G06F 12/02 (2006.01)
G11C 11/56 (2006.01)
G11C 16/04 (2006.01)
G11C 16/34 (2006.01)
G06F 12/00 (2006.01)

(52) U.S. Cl.
CPC ........ G06F 12/0246 (2013.01); G11C 11/5628 (2013.01); G11C 16/0483 (2013.01); G11C 16/3454 (2013.01)

(58) Field of Classification Search
CPC ............ G11C 11/34; G06F 12/00; G06F 3/00
USPC ............................ 365/185.01; 711/100; 710/1
See application file for complete search history.

(56) References Cited

U.S. PATENT DOCUMENTS

| | | | | |
|---|---|---|---|---|
| 5,052,002 A | * | 9/1991 | Tanagawa | 714/805 |
| 6,058,060 A | * | 5/2000 | Wong | 365/218 |
| 7,038,951 B2 | * | 5/2006 | Hirano et al. | 365/185.29 |
| 7,080,192 B1 | * | 7/2006 | Wong | 711/103 |
| 7,236,406 B2 | * | 6/2007 | Ito et al. | 365/185.3 |
| 7,428,174 B2 | * | 9/2008 | Taito et al. | 365/185.33 |

(Continued)

FOREIGN PATENT DOCUMENTS

| | | |
|---|---|---|
| JP | 2009-129479 A | 6/2009 |
| JP | 2009-259326 A | 11/2009 |

(Continued)

OTHER PUBLICATIONS

Japanese Office Action dated Jan. 16, 2015 in counterpart Japanese Patent Application No. 2012-205059.

*Primary Examiner* — Christopher Shin
(74) *Attorney, Agent, or Firm* — Patterson & Sheridan, LLP

(57) ABSTRACT

A semiconductor memory device includes a plurality of memory strings each of which includes a series of memory cells that each store data having n bits ($n \geq 3$), word lines, each connected in common to memory cells of different memory strings, and a control circuit which controls a first write operation and a second write operation. The first write operation includes a first step where a middle threshold voltage distribution is formed in memory cells and a second step following the first step where threshold voltages of some of the memory cells are increased, and the second write operation includes a step where threshold voltage distributions which correspond to the data having n bits is formed in the memory cells, wherein a write verify operation is performed after the first step but not after the second step of the first write operation.

20 Claims, 16 Drawing Sheets

(56) References Cited

U.S. PATENT DOCUMENTS

| | | | |
|---|---|---|---|
| 7,773,426 B2* | 8/2010 | Matsubara et al. | 365/185.22 |
| 8,130,552 B2 | 3/2012 | Miwa et al. | |
| 8,885,429 B1* | 11/2014 | Van Winkelhoff et al. | 365/218 |
| 2002/0110023 A1* | 8/2002 | Yoshida | 365/185.22 |
| 2002/0154547 A1* | 10/2002 | Hirano | 365/185.33 |
| 2005/0057972 A1* | 3/2005 | Taito et al. | 365/185.28 |
| 2005/0228962 A1* | 10/2005 | Takase et al. | 711/168 |
| 2007/0242521 A1* | 10/2007 | Taito et al. | 365/185.23 |
| 2009/0010068 A1 | 1/2009 | Lee | |
| 2010/0020160 A1 | 1/2010 | Ashbey | |
| 2010/0238725 A1 | 9/2010 | Naruke | |
| 2012/0092929 A1* | 4/2012 | Shibata et al. | 365/185.11 |
| 2013/0159785 A1* | 6/2013 | Hashimoto | 714/47.2 |
| 2014/0082266 A1* | 3/2014 | Fujiu | 711/103 |
| 2014/0095665 A1* | 4/2014 | Mathur et al. | 709/219 |
| 2014/0241029 A1* | 8/2014 | Iwata | 365/72 |

FOREIGN PATENT DOCUMENTS

| | | |
|---|---|---|
| JP | 2011233209 A | 11/2011 |
| JP | 2012-123856 A | 6/2012 |
| JP | 2012-142067 A | 7/2012 |
| JP | 2013-509651 A | 3/2013 |

* cited by examiner

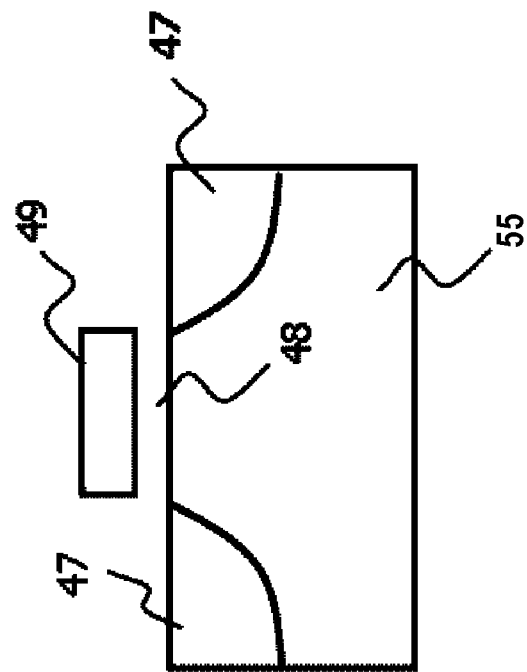
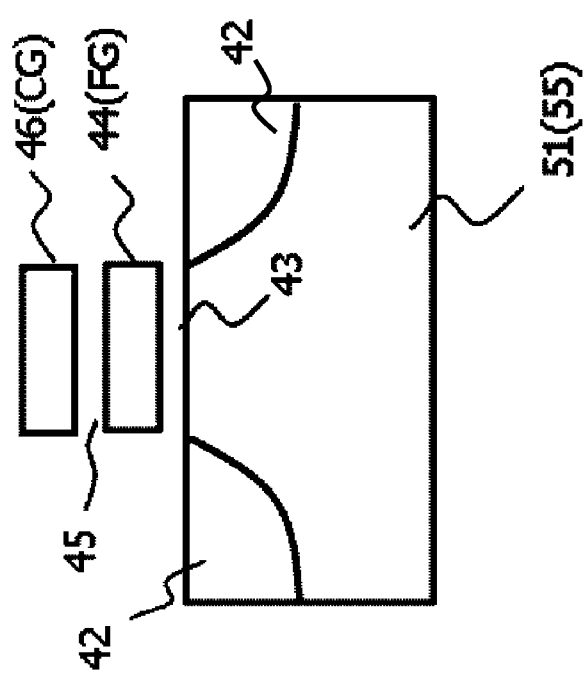

FIG. 5

| | Cell(P-Well) | Cell(N-Well) | SELECTED WL | NON-SELECTED WL | BL |
|---|---|---|---|---|---|
| ERASE | Vera (20V) | Vera (20V) | Vss (0V) | Floating | Floating |
| WRITE | Vss (0V) | Vss (0V) | VPGM | VPASS etc. | L(0V)/H(2.5V) |
| READ | Vfix (1.5V/0V) | Vfix (1.5V/0V) | VCGRV | VREAD etc. | H(2.5V) |

FIG. 13

S10 Level

|   | Er | A | B | C | D | E | F | G |
|---|----|---|---|---|---|---|---|---|
| ADL | 1 | 0 | 0 | 0 | 0 | 1 | 1 | 1 |
| BDL | 1 | 1 | 0 | 0 | 1 | 1 | 0 | 0 |
| CDL | – | – | – | – | – | – | – | – |

S12 Level

|   | Er | A | B | C | D | E | F | G |
|---|----|---|---|---|---|---|---|---|
| ADL | 1 | 0 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |

S14 Level

|   | Er | A | B | C | D | E | F | G |
|---|----|---|---|---|---|---|---|---|
| ADL | 1 | 1 | 1 | 1 | 0 | 0 | 0 | 0 |
| BDL | 1 | 1 | 0 | 0 | 1 | 1 | 0 | 0 |
| CDL | 1 | 0 | 1 | 0 | 1 | 0 | 1 | 0 |

S15 Level

|   | Er | A | B | C | D | E | F | G |
|---|----|---|---|---|---|---|---|---|
| ADL | 1 | 1 | 1 | 1 | 0 | 0 | 0 | 0 |
| BDL | 1 | 1 | 1 | 1 | 0 | 0 | 0 | 0 |
| CDL | 1 | 1 | 1 | 0 | 1 | 1 | 1 | 0 | ial
NONVOLATILE SEMICONDUCTOR MEMORY DEVICE

CROSS-REFERENCE TO RELATED APPLICATION

This application is based upon and claims the benefit of priority from Japanese Patent Application No. 2012-205059, filed Sep. 18, 2012, the entire contents of which are incorporated herein by reference.

FIELD

Embodiments described herein relate generally to a nonvolatile semiconductor memory device, and more particularly to data writing in a NAND-type flash memory which can store data having 3 bits or more in one memory cell.

BACKGROUND

In a NAND-type flash memory, a plurality of memory cells arranged along a column direction are connected to each other in series so as to form memory strings, and each memory string is connected to a corresponding bit line through a selection gate. Each bit line is connected to a sense amplifier circuit which performs sensing of write data and read data. All or half of a plurality of memory cells arranged in the word line direction are simultaneously selected, and a write operation or a read operation is collectively performed with respect to such memory cells which are simultaneously selected.

Recently, along with the reduction in size of the memory string, inter-cell interference between neighboring memory cells has increased. Because of this inter-cell interference, a possibility that erroneous data being written at the time of writing data in the memory cell has increased.

DESCRIPTION OF THE DRAWINGS

FIG. 3A and FIG. 3B are cross-sectional views showing one example of a memory cell and one example of a selection transistor respectively.

FIG. 5 is a table showing an example of voltages supplied to respective regions shown in FIG. 4.

FIG. 13 is a view showing one example of a data holding state of a data latch.

DETAILED DESCRIPTION

Embodiments provide a nonvolatile semiconductor memory device in which a possibility of erroneous writing can be decreased.

In general, according to one embodiment, a semiconductor memory device includes: a memory cell array including a plurality of memory strings each of which includes a series of memory cells that each store data having n bits (where n is an integer of 3 or more), word lines, each connected in common to memory cells of different memory strings, bit lines, each connected to first end one of the memory strings, a source line connected to second ends of the memory strings, a sense amplifier circuit connected to the bit lines, a plurality of latch circuits connected to the sense amplifier circuit, and a control circuit which controls a first write operation and a second write operation. The first write operation includes a first step where a middle threshold voltage distribution above an erased state is formed in memory cells that are commonly connected to selected word lines by performing a writing verification operation at a first verification voltage and a second step following the first step where threshold voltages of some of the memory cells are increased, and the second write operation includes a step where threshold voltage distributions which correspond to the data having n bits is formed in the memory cells. The control circuit is configured to perform a write verify operation after the first step but not after the second step.

Hereinafter, exemplary embodiments are explained in conjunction with the drawings.

Figure 1:
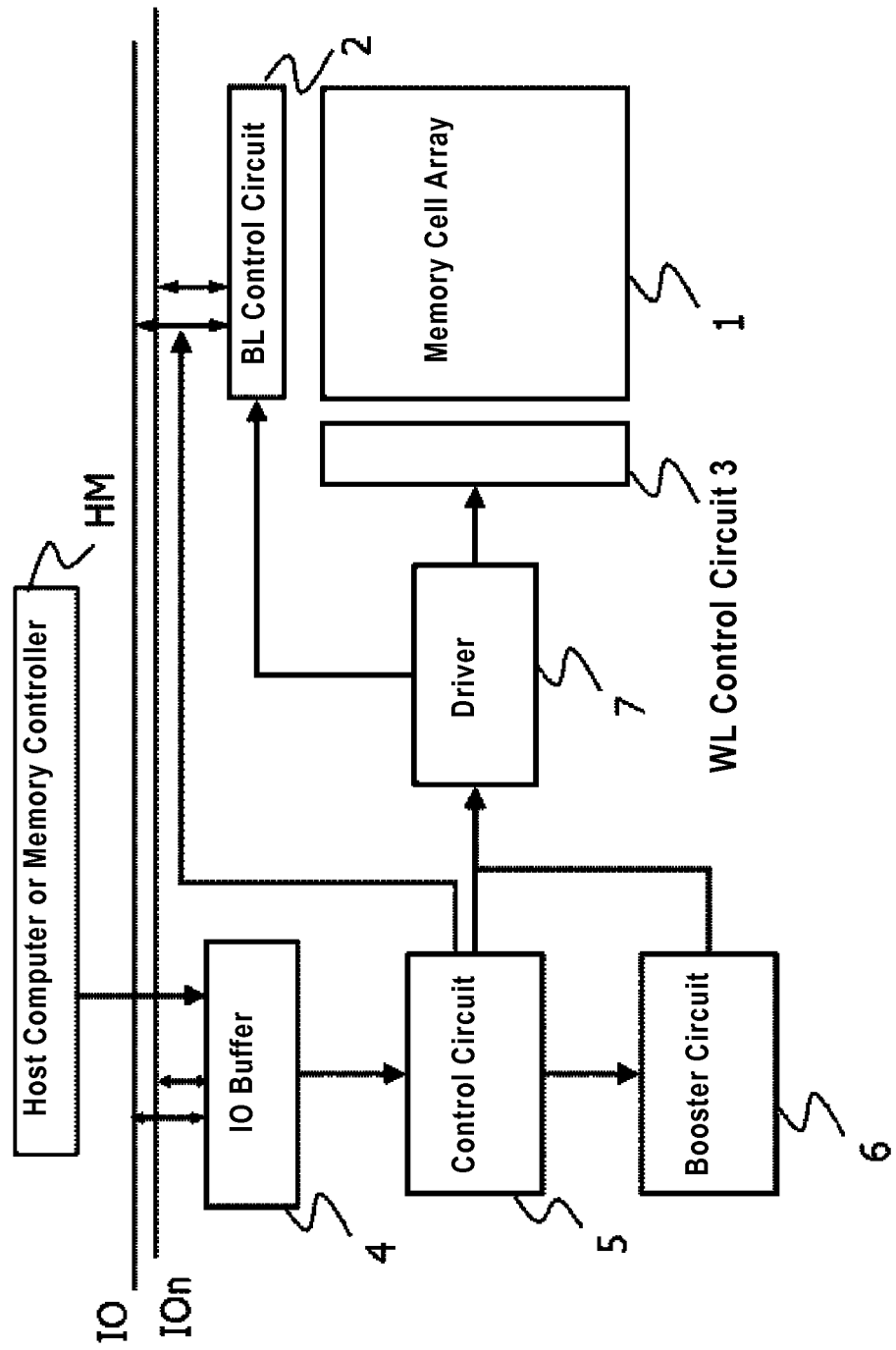
FIG. 1 is a block diagram showing one example of a semiconductor memory device according to an embodiment.
Figure 2:
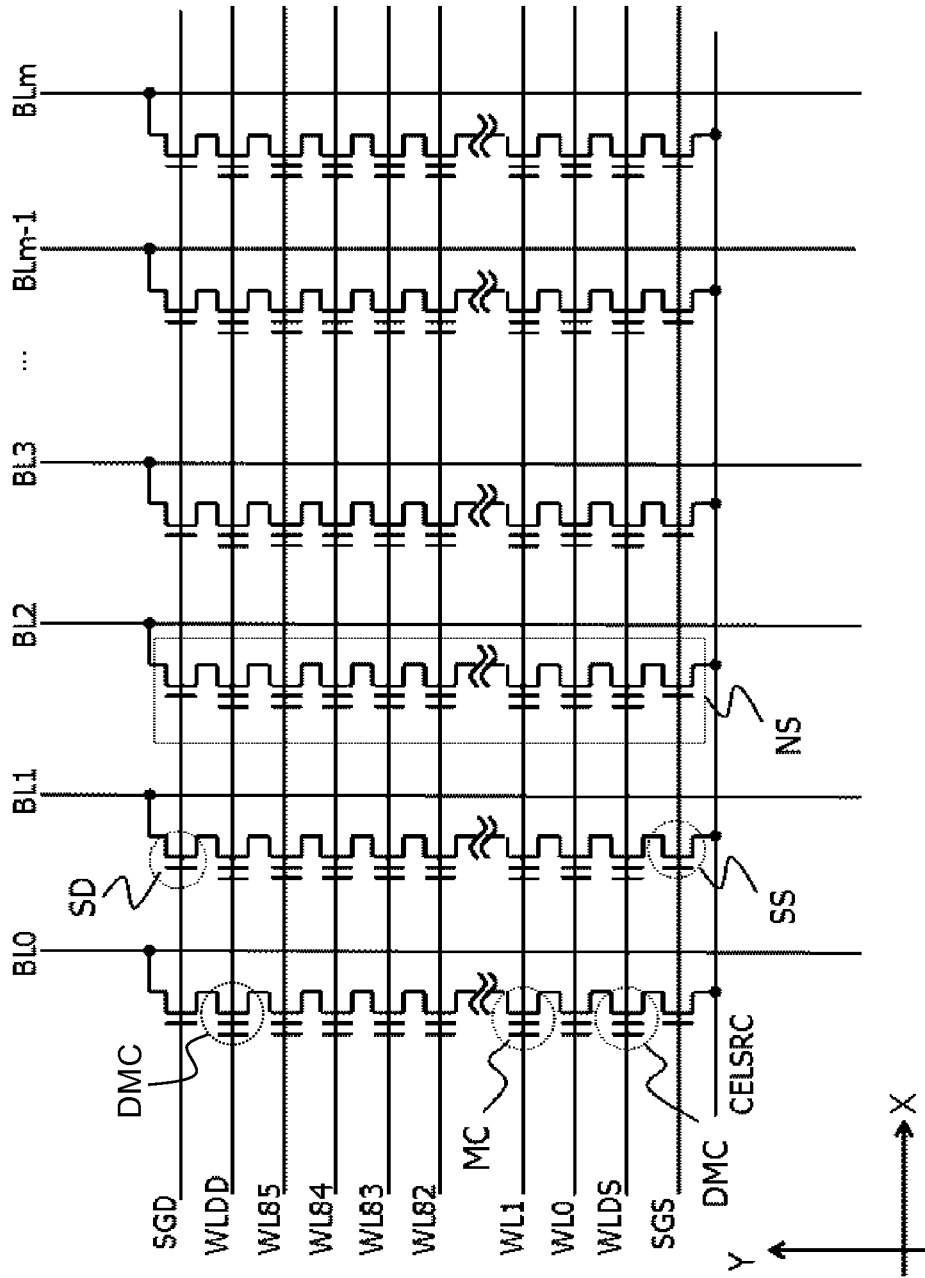
FIG. 2 is a circuit diagram showing one example of a memory cell array according to the embodiment.

First, a semiconductor memory device of one embodiment is described using a NAND-type flash memory as an example and in conjunction with FIG. 1 and FIG. 2.

The NAND-type flash memory is provided with a memory cell array 1 where memory cells MC in which data is stored are arranged in a matrix configuration. The memory cell array 1 includes: a plurality of bit lines BL; a plurality of word lines WL; a common source line CELSRC; and a plurality of memory cells MC. The memory cells MC are configured such that data of n bit (n: natural number of 3 or more) can be stored in one memory cell.

Various commands CMD which control an operation of the NAND-type flash memory, an address ADD, and data DT which are supplied from a host computer or a memory controller HM are inputted to an IO buffer 4. Write data inputted to the IO buffer 4 is supplied to the bit lines BLs selected by a bit line control circuit 2 through data input and output lines IO, IOn. Various commands CMD and the address ADD are inputted to a control circuit 5 and the control circuit 5 controls a booster circuit 6 and a driver 7 based on the commands CMD and the address ADD. Besides the commands CMD, the address ADD and data DT, a control signal ALE (Address Latch Enable), a control signal CLE (Command Latch Enable), a control signal WE (Write Enable) and a control signal RW (Read Enable) are inputted to the IO buffer 4.

The booster circuit 6 is controlled by the control circuit 5 such that the booster circuit 6 generates voltages necessary for writing, reading and erasing, and supplies the voltages to the driver 7. The driver 7 is also controlled by the control circuit 5 such that these voltages are supplied to the bit line control circuit 2 and the word line control circuit 3. The bit line control circuit 2 and the word line control circuit 3, based on these voltages, read data from the memory cells MC, write data in the memory cells MC, and erase data in the memory cells.

To the memory cell array 1, the bit line control circuit 2 for controlling voltages of the bit lines BL and the word line control circuit 3 for controlling voltages of the word lines WL are connected. Further, the bit line control circuit 2 and the word line control circuit 3 are connected to the driver 7.

That is, the driver 7 controls the bit line control circuit 2 based on the address ADD, and reads out data in the memory cells MC in the memory cell array 1 through the bit lines BL. The driver 7 also controls the bit line control circuit 2 based on the address ADD, and writes data in the memory cells MC in the memory cell array 1 through the bit lines BL.

The bit line control circuit 2, the word line control circuit 3, the driver 7 and the control circuit 5 may be also collectively referred to as "control circuit".

FIG. 2 shows one example of the circuit diagram of the memory cell array 1 shown in FIG. 1. A plurality of memory cells are arranged in the memory cell array 1. One NAND string NS includes a memory string which is formed of 86 memory cells MC, for example, and selection transistors SD, SS which are connected in series in the bit line direction (Y direction in FIG. 2). A dummy memory cell DMC may be arranged between the memory string and the selection transistor SD, and between the memory string and the selection transistor SS.

A plurality of NAND strings NS (m+1 strings in the example shown in FIG. 2) are arranged in the word line direction (X direction in FIG. 2), and each of the plurality of bit lines BL is connected to one end of a NAND string, and the common source line CELSRC is connected to the other end of the NAND string. In other words, a plurality of NAND strings NS are arranged in the word line direction such that one end of each NAND string is connected to one of the plurality of bit lines BL, and the other end of each NAND string is connected to the common source line CELSRC. Control lines (gate electrodes) of the selection transistors SD, SS are connected to selection gates SGD, SGS, respectively.

The word lines WL extend in the word line direction, and the memory cells MC which are arranged in the word line direction are connected to the word line WL in common. The memory cells MC which are connected in the word line direction constitute 1 page. Writing of data in the memory cell MC is performed in units of a page. It should be noted that "page" which is a write unit is conceptually different from "lower page", "middle page" and "upper page" which constitute a data writing bit distribution described below. NAND strings NS arranged in the word line direction constitute one block. Erasing of the memory cell MC is performed in units of a block.

FIG. 3A is a cross-sectional view of the memory cell and FIG. 3B is a cross-sectional view of the selection transistor. In the memory cell shown in FIG. 3A, n-type diffusion layers 42, which constitute a source and a drain of the memory cell, are formed on a substrate 51 (P-type well region 55 described later). A charge storage layer (FG) 44 is formed over the P-type well region 55 with a gate insulation film 43 interposed therebetween, and a control gate (CG) 46 is formed over the charge storage layer 44 with an insulation film 45 interposed therebetween. In the selection transistor shown in FIG. 3B, n-type diffusion layers 47 which constitute a source and a drain of the selection transistor are formed on the P-type well region 55. A control gate 49 is formed over the P-type well region 55 with a gate insulation film 48 interposed therebetween.

A threshold voltage of the memory cell can be changed by changing an amount of charge stored in the charge storage layer (FG) 44. Data can be stored in the memory cells by allocating data to the memory cells corresponding to the threshold voltages. Usually, a plurality of memory cells are used for storing large data. As a result, threshold values of the memory cells have threshold value distributions which correspond to respective data.

Figure 4:
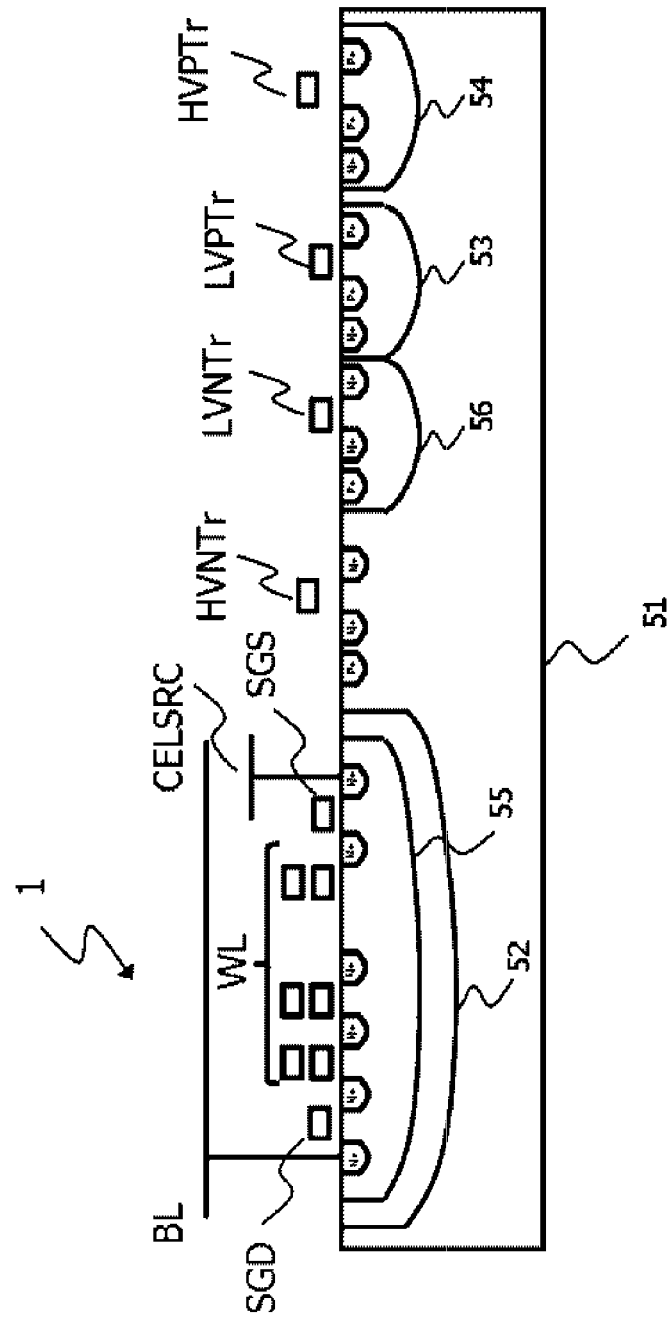
FIG. 4 is a cross-sectional view showing one example of a NAND-type flash memory in cross section.

FIG. 4 is a cross-sectional view of the NAND-type flash memory. For example, N-type well regions 52, 53, 54, and a P-type well region 56 are formed in the P-type semiconductor substrate 51. The P-type well region 55 is formed in the N-type well region 52. The memory cells Tr which constitute the memory cell array 1 are formed in the P-type well region 55. Further, a low voltage P channel transistor LVPTr and a low voltage N channel transistor LVNTr which constitute the control circuit 5 are formed in the N-type well region 53 and the P-type well region 56, respectively, for example. For example, a high voltage N channel transistor HVNTr which connects the word line and the word line control circuit 3 to each other is formed in the substrate 51. For example, a high voltage P channel transistor HVPTr which constitutes the word line control circuit 3 or the like is formed in the N-type well region 54. As shown in FIG. 4, the high voltage transistors HVNTr, HVPTr have a thick gate insulation film compared to the low voltage transistors LVNTr, LVPTr.

FIG. 5 shows an example of a voltage which is supplied to the respective regions shown in FIG. 4. During an erase operation, a program (write) operation and a read operation, voltages shown in FIG. 5 are supplied to the respective regions. Here, Vera indicates a voltage applied to the substrate at the time of erasing data, Vss indicates a ground voltage, and Vdd indicates a power source voltage. A write voltage Vpgm is a voltage supplied to selected word line at the time of writing data. A read voltage Vcgrv is a variable voltage supplied to the selected word line at the time of reading data. A read pass voltage Vread is a voltage supplied to non-selected word lines at the time of reading data. A write pass voltage Vpass is a voltage supplied to non-selected word lines at the time of writing data.

Figure 6B:
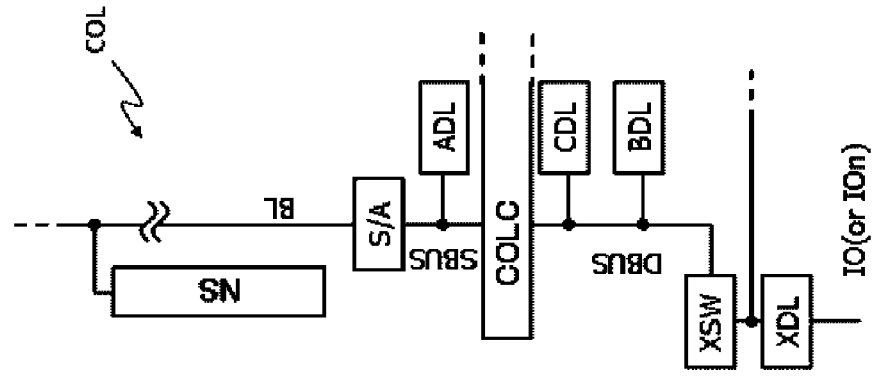
FIG. 6B is a block diagram showing a column unit in the bit line control circuit.
Figure 6A:
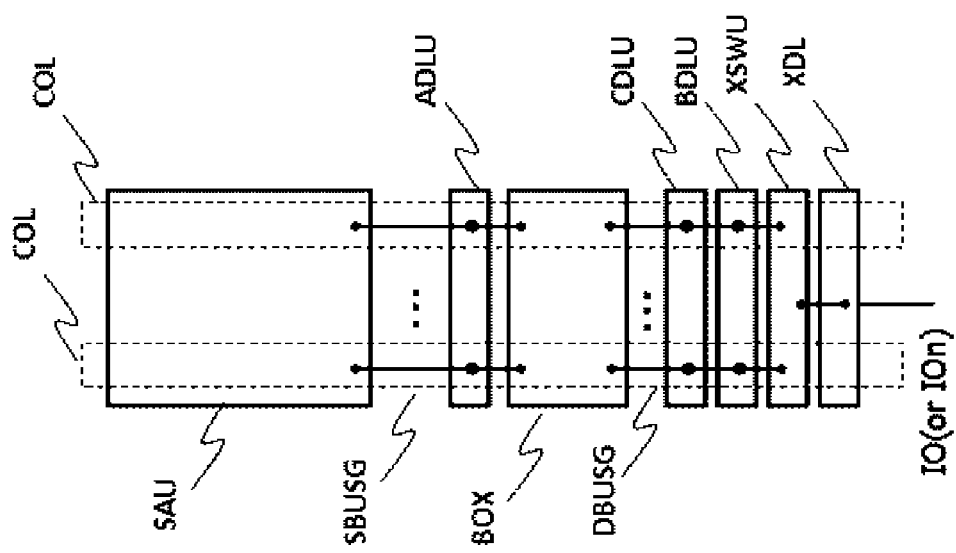
FIG. 6A is a block diagram showing one example of a bit line control circuit.

FIG. 6A is a block diagram showing one example of the circuit configuration of the bit line control circuit 2. As shown in FIG. 6A, the bit line control circuit 2 includes a sense amplifier unit SAU, data latch units ADLU, BDLU, CDLU, a group of arithmetic operation circuits BOX, a group of switching circuits XSWU, and a data latch XDL. The sense amplifier unit SAU, the data latch unit ADLU and the group of arithmetic operation circuits BOX are connected with each other by a group of data lines SBUSG.

Each sense amplifier unit SAU has a plurality of sense amplifier circuits S/A. Each data latch unit ADLU has a plurality of data latches ADL, each data latch unit BDLU has a plurality of data latches BDL, and each data latch unit CDLU has a plurality of data latches CDL. The group of arithmetic operation circuits BOX has a plurality of arithmetic operation circuits COLC. The group of switching circuits XSWU has a plurality of switching circuits XSW. The switching circuit XSW is formed of a MOS transistor, for example. The sense amplifier circuit S/A, the data latches ADL, BDL, CDL, the arithmetic operation circuit COLC and the switching circuit XSW constitute one column unit COL.

FIG. 6B is a block diagram showing one example of the column unit. One end of the NAND string NS is connected to the bit line BL. One end of the bit line BL is connected to the sense amplifier circuit S/A. The sense amplifier circuit S/A detects a potential or an electric current of the bit line BL, and determines data to be held in the memory cell MC based on the detection value. The sense amplifier circuit S/A may include a data latch which stores the determined data in addition to the data latch ADL. The sense amplifier circuit S/A is connected to the data latch ADL via the data bus SBUS.

Besides the data latch ADL, other data latches may be connected to the data bus SBUS. The data bus SBUS is connected to the arithmetic operation circuit COLC. The arithmetic operation circuit COLC may be used in common with other column units COL. That is, one arithmetic operation circuit COLC may be used in common by the plurality of column units COL. The arithmetic operation circuit COLC is connected to the data latches BDL, CDL and the switching circuit XSW via the data bus DBUS. Here, besides the data latches BDL, CDL, other data latches may be connected to the data bus DBUS.

The arithmetic operation circuit COLC can transfer data held in the data latches BDL, CDL to the data latch ADL after applying an arithmetic operation to data, and also can transfer data held in the data latches BDL, CDL to the data latch XDL via the switching circuit XSW after applying an arithmetic operation to data. Further, the arithmetic operation circuit COLC also can transfer data held in the data latch ADL to the data latch BDL after reversing the data.

The switching circuit XSW is connected to the data latch XDL. That is, the plurality of column units COL are connected to the data latch XDL, and data can be transferred to the data latch XDL from the column unit COL which is selected when the control circuit 5 controls the switching circuit XSW. The data latch XDL is connected to the data input and output line IO (or the data input and output line IOn). The control circuit 5 outputs data held in the data latch XDL to the data input and output line IO, or the control circuit 5 inputs data to the data latch XDL from the data input and output line IO, and can hold the data in the data latch XDL.

Hereinafter, the above-mentioned data latches ADL, BDL, CDL, and XDL may be also collectively referred to as "data latch DL".

(Threshold Value Distributions of Memory Cells)

Figure 7:
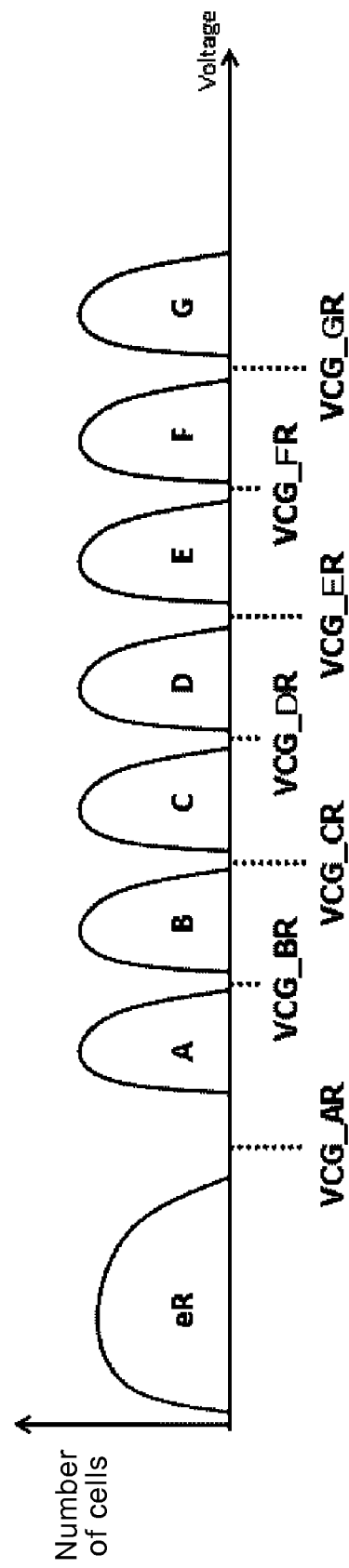
FIG. 7 is a view showing one example of the threshold value distribution of the memory cell when octal data is stored.

The threshold value distributions of the memory cells MC and the storage of data are explained in conjunction with FIG. 7. FIG. 7 shows one example of the threshold value distributions of the memory cells MC when the NAND-type flash memory stores octal data, for example.

For example, when data having 3 bits is stored in one memory cell MC, as shown in FIG. 7, the threshold values of a plurality of memory cells MC exhibit eight threshold value distributions. The threshold value distributions include an "eR" distribution (erased state), an "A" distribution, a "B" distribution, a "C" distribution, a "D" distribution, an "E" distribution, a "F" distribution, and a "G" distribution in an ascending order of threshold voltage. Assuming upper data, middle data, lower data in order from the left side, data having 3 bits can be allocated to the threshold value distributions as follows. For example, "111" data can be allocated to the "eR" distribution, "110" data can be allocated to the "A" distribution, "100" data can be allocated to the "B" distribution, "000" data can be allocated to the "C" distribution, "010" data can be allocated to the "D" distribution, "011" data can be allocated to the "E" distribution, "001" data can be allocated to the "F" distribution, and "101" data can be allocated to the "G" distribution.

(Read Operation)

A data read operation of the NAND-type flash memory is explained. The data read operation is performed in such a manner that the control circuit 5 selects one selected word line WLs from the plurality of word lines WL, and applies a read voltage Vcgrv to the selected word line WLs. In other words, the control circuit 5 selects one page. With respect to non-selected word lines WLns other than the selected word line WLs, a read pass voltage Vread which turns on the memory cells MC is applied to the non-selected word lines WLns irrelevant to threshold voltages of the memory cell MCs. The read pass voltage Vread is not limited to the same voltage with respect to all non-selected word lines WLns, and the read pass voltage Vread may differ among non-selected word lines WLns. The selected transistors SD, SS are turned on after 0V is applied to the common source line and a precharge voltage is applied to the bit line BL. When the threshold voltage of the memory cell MC is higher than a program voltage, a voltage charged in the bit line BL is not discharged. A potential of this bit line BL is detected by the sense amplifier circuit S/A, and data in the memory cell MC is determined to be "0" data. On the other hand, when the threshold voltage of the memory cell MC is lower than the program voltage, a voltage charged in the bit line BL is discharged. A potential of this bit line BL is detected by the sense amplifier circuit S/A, and data in the memory cell MC is determined to be "1" data. 0V (positive voltage depending on a case) may be applied to the P-type well region 55 of the memory cell.

A read voltage Vcgrv differs depending on a page to be read (meaning "upper page" or the like in this read operation). In the example shown in FIG. 7, the read voltage Vcgrv is set between the respective threshold value distributions. For example, a read voltage VCG_BR is set between the "A" distribution and the "B" distribution, a read voltage VCG_CR is set between the "B" distribution and the "C" distribution, ..., and a read voltage VCG_GR is set between the "F" distribution and the "G" distribution.

In reading out a lower page, the control circuit 5 performs a read operation at the read voltage Vcg_AR and the read voltage Vcg_ER. As a result, a memory cell MC having the threshold voltage between the read voltage Vcg_AR and the read voltage Vcg_ER is determined to be "0" data, and memory cells MC other than such a memory cell MC is determined to be "1" data.

In reading out a middle page, the control circuit 5 performs a read operation at the read voltage Vcg_BR, the read voltage Vcg_DR and the read voltage VCG_FR. As a result, a memory cell MC having the threshold voltage between the read voltage Vcg_BR and the read voltage Vcg_DR and a memory cell MC having the threshold voltage larger than the read voltage Vcg_FR are determined to be "0" data, and memory cells MC other than such memory cell MC is determined to be "1" data.

In reading out upper page, the control circuit 5 performs a read operation at the read voltage Vcg_CR and the read voltage Vcg_GR. As a result, a memory cell MC having the threshold voltage between the read voltage Vcg_CR and the read voltage Vcg_GR is determined to be "0" data, and memory cells MC other than such a memory cell MC are determined to be "1" data.

(Erase Operation)

The erase operation is performed in accordance with every block unit. The control circuit 5 applies a voltage described in the column "erase" in FIG. 5 to the memory cells MC. After performing the erase operation, the threshold voltages of all memory cells MC in the block exhibit the "eR" distribution shown in FIG. 7.
(Write Operation According to First Embodiment)

A write operation according to the first embodiment is explained in conjunction with FIG. 8 to FIG. 15.
(Sequence of Writing Data in Memory Cells MC)

Figure 8:
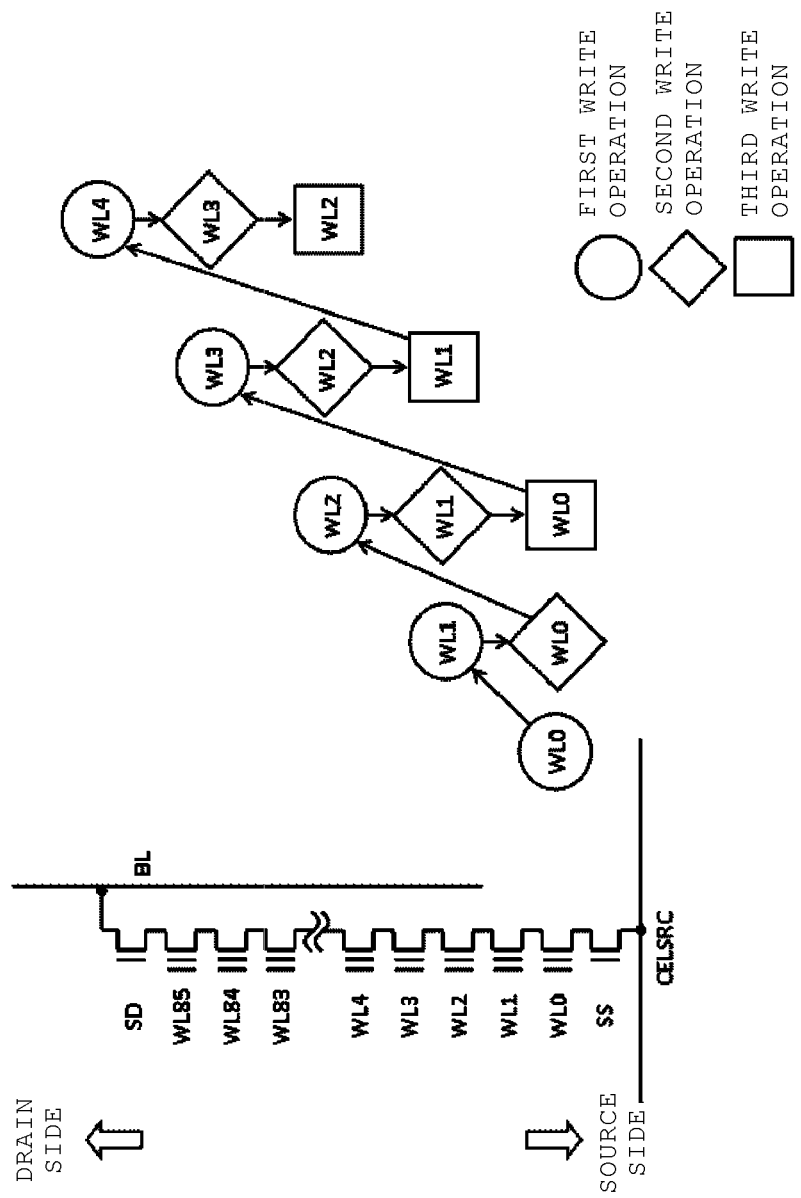
FIG. 8 is a view for explaining one example of the sequence of writing data in the memory cells.

FIG. 8 is a view for explaining one example of the sequence of writing data in the memory cells MC. The write operation of the first embodiment is includes first to third write operations. By writing data to the memory cells MC in accordance with the first to third write operations, the inter-cell interference imparted to the neighboring memory cells MC can be decreased.

Hereinafter, a side where the bit lines are connected (a side where the selection transistors SD are arranged) is referred to as a drain side, and a side where the memory cells MC are connected to the common source line CELSRC (a side where the selection transistors SS are arranged) is referred to as a source side.

For example, the control circuit 5 first selects the plurality of memory cells MC0 connected to the word line WL0. Hereinafter, this operation may be also referred to as an operation of selecting the word line WL. The control circuit 5 performs the first write operation with respect to the memory cells MC0. Next, the control circuit 5 selects the word line WL1 arranged adjacent to the word line WL0 on the drain side. The control circuit 5 performs the first write operation with respect to the plurality of memory cells MC1 connected to the word line WL1. Next, the control circuit 5 selects the word line WL0. The control circuit 5 performs the second write operation with respect to the plurality of memory cells MC0.

Next, the control circuit 5 selects the word line WL2 arranged adjacent to the word line WL1 on the drain side. The control circuit 5 performs the first write operation with respect to a plurality of memory cells MC2 connected to the word line WL2. Next, the control circuit 5 selects the word line WL1. The control circuit 5 performs the second write operation with respect to the plurality of memory cells MC1. Next, the control circuit 5 selects the word line WL0. The control circuit 5 performs the third write operation with respect to the plurality of memory cells MC0. With the completion of the third write operation, the write operation of the plurality of memory cells MC0 is finished.

Next, the control circuit 5 selects the word line WL3 arranged adjacent to the word line WL2 on the drain side. The control circuit 5 performs the first write operation with respect to the plurality of memory cells MC3 connected to the word line WL3. Next, the control circuit 5 selects the word line WL2. The control circuit 5 performs the second write operation with respect to the plurality of memory cells MC2. Next, the control circuit 5 selects the word line WL1. The control circuit 5 performs the third write operation with respect to the plurality of memory cells MC1. With the completion of the third write operation, the write operation of the plurality of memory cells MC1 is finished.

By repeatedly performing the above-mentioned operations, the control circuit sequentially writes data in the memory cells MC arranged in the memory cell array 1. Next, the first to third write operations are explained.
(First Write Operation)

Figure 9:
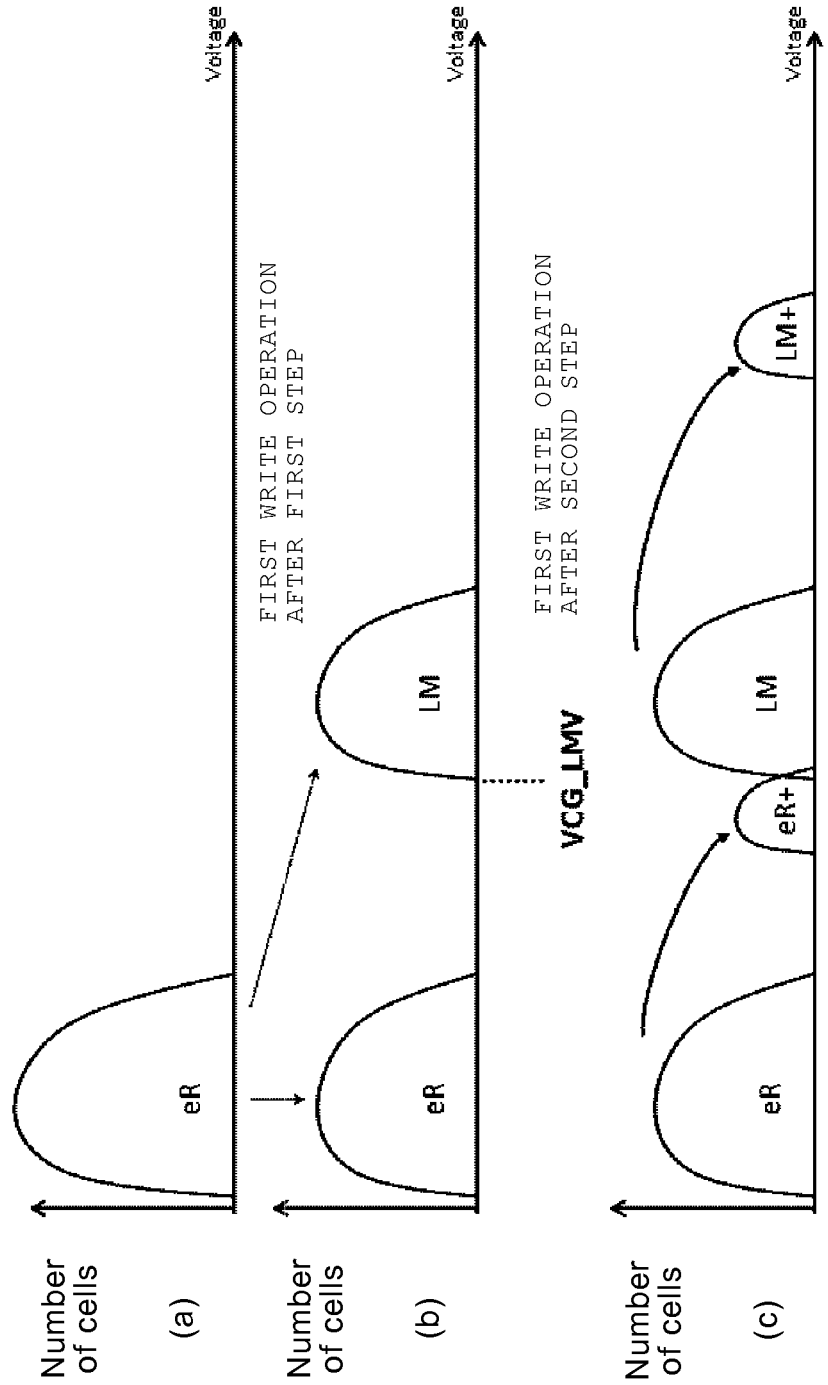
FIG. 9 is a view showing one example of a transition of the threshold value distribution of the memory cells during a write operation according to a first embodiment.
Figure 10:
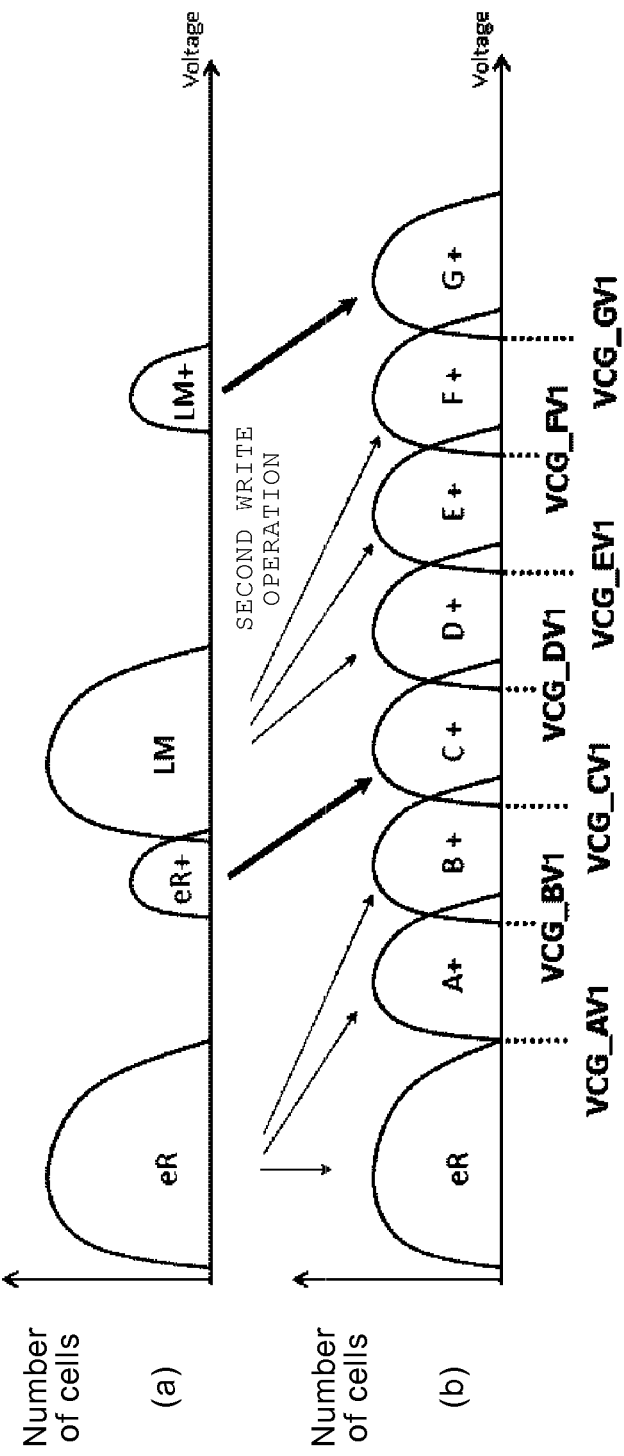
FIG. 10 is a view showing one example of the transition of the threshold value distribution of the memory cells during a write operation according to the first embodiment following the write operation shown in FIG. 9.
Figure 11:
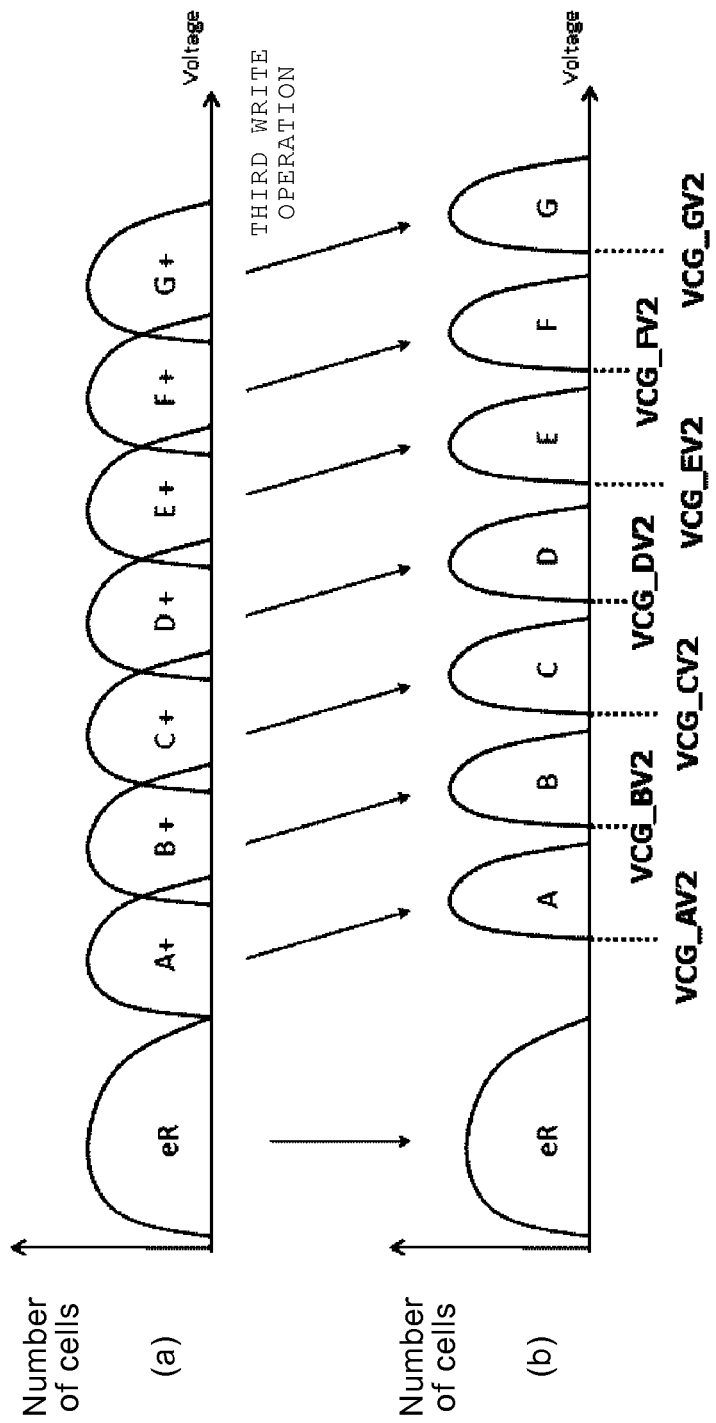
FIG. 11 is a view showing one example of the transition of the threshold value distribution of the memory cells during a write operation according to the first embodiment following the write operation shown in FIG. 10.
Figure 12:
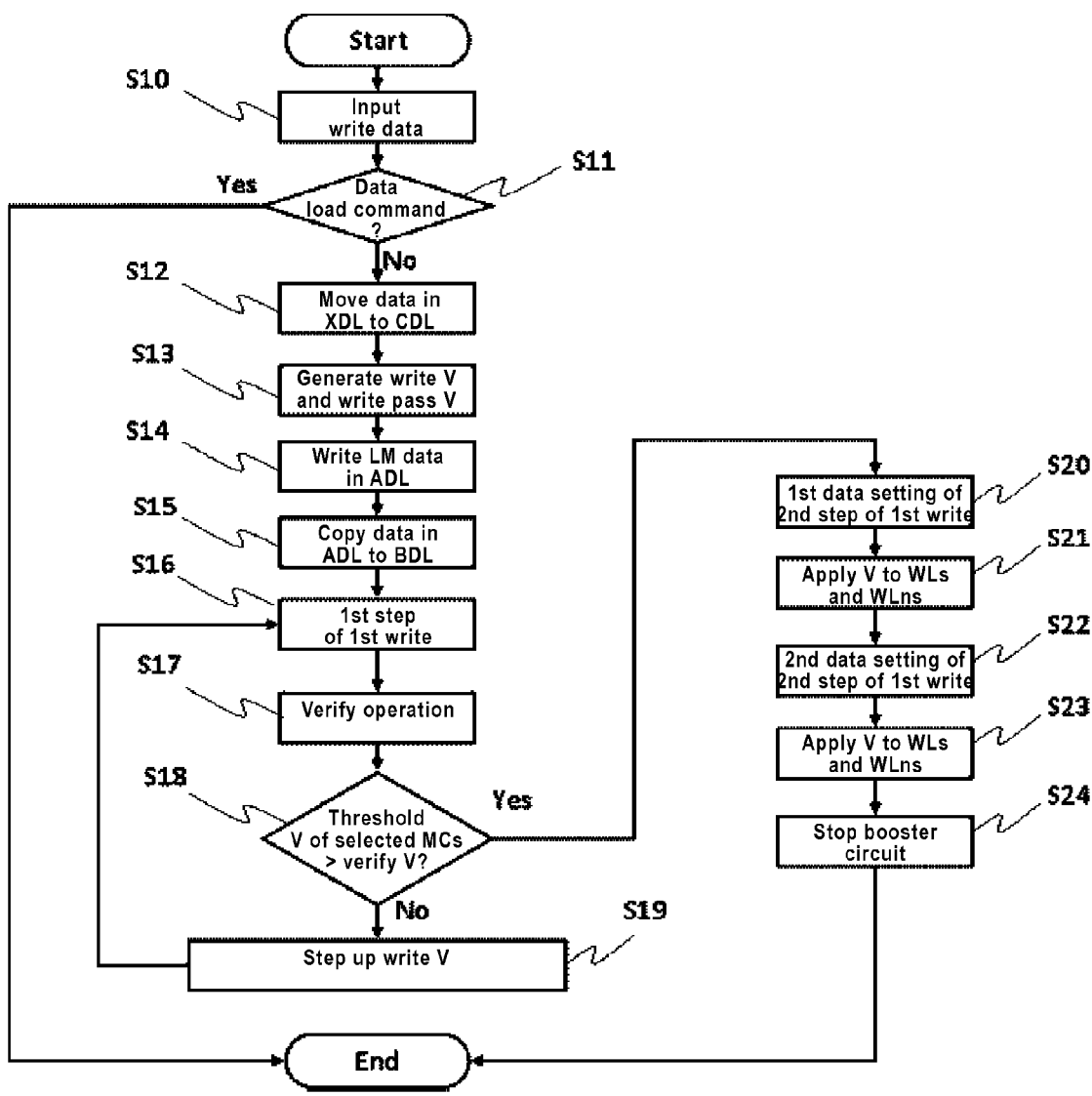
FIG. 12 is a view showing a flowchart of one example of a first write operation.

FIG. 9 to FIG. 11 show one example of the transition of the threshold value distribution of the memory cells MC during the write operation. FIG. 12 is a flowchart showing one example of the first write operation. FIG. 13 shows one example of data holding states in data latches ADL, BDL, CDL.

In step S10, write data on the lower page is inputted to the NAND-type flash memory from the host computer or the memory controller HM, and the write data on the lower page is held in the data latch XDL. The control circuit 5 moves the write data on the lower page held in the data latch XDL to the data latch ADL, for example. Next, write data on the middle page is inputted to the NAND-type flash memory from the host computer or the memory controller HM, and the write data on the middle page is held in the data latch XDL. The control circuit 5 moves the write data on the middle page held in the data latch XDL to the data latch BDL, for example. As a result, a state of the data latch DL is brought into a state of step S10 shown in FIG. 13.

Next, write data on the upper page is inputted to the NAND-type flash memory from the host computer or the memory controller HM, and the write data on the upper page is held in the data latch XDL.

In step S11, the control circuit 5 confirms whether or not a data load command is transmitted to the NAND-type flash memory from the host computer or the memory controller HM. When the data load command is transmitted to the NAND-type flash memory, the control circuit 5 finishes the write operation. When the data load command is not transmitted to the NAND-type flash memory, the control circuit 5 moves the write data on the upper page held in the data latch XDL to the data latch CDL, for example (step S12). As a result, a state of the data latch DL is brought into a state of step S12 shown in FIG. 13.

The case where the loading of write data on the lower page and the middle page is performed, is a case where a data load command is transmitted to the NAND-type flash memory from the host computer or the memory controller HM, and the control circuit 5 finishes writing in step S11 shown in FIG. 12, for example.

Next, in step S13, the control circuit 5 activates the booster circuit 6 for generating a write voltage Vpgm and a write pass voltage Vpass. Further, the control circuit 5 sets a write voltage Vpgm which is used in the first step of the first write operation described later as an initial set value Vpgm_LM, and sets a write pass voltage Vpass which is used in the first step of the first write operation as an initial set value Vpass_LM.

In step S14, the control circuit 5 forms "LM" write data which is upper quaternary data for octal data based on data in data latches ADL, BDL, CDL using the arithmetic operation circuit COLC, and the "LM" write data is held in the data latch ADL. When a threshold voltage of the selected memory cell MC (hereinafter referred to as "selected memory cells MCs") is to be increased, "0" data is held in the data latch ADL. On the other hand, when the threshold voltage of the selected memory cells MCs is not to be increased, "1" data is held in the data latch ADL. As a result, data held in the data latch DL becomes data in step S14 shown in FIG. 13. There may be a case where data in the data latches BDL, CDL is changed into data in step S14 shown in FIG. 13 when forming "LM" write data.

In step S15, the control circuit 5 copies "LM" write data to the inner data latch BDL. The control circuit 5 holds the "0" data in the data latch CDL when the control circuit 5 writes a threshold voltage of the selected memory cells MCs in the "C" distribution and the "G" distribution in the "eR" distribution, the "A" distribution, the "B" distribution, the "C" distribution, the "D" distribution, the "E" distribution, the "F" distribution and the "G" distribution using the arithmetic operation circuit COLC. The control circuit 5 holds "1" data in the data latch CDL when the control circuit 5 writes a threshold voltage of the selected memory cells MCs in the distributions other than the "C" distribution and the "G" distribution. As a result, data held in the data latch DL becomes data in step S15 shown in FIG. 13.

Thereafter, the control circuit 5 transfers "LM" write data held in the data latch ADL to the data latch arranged in the sense amplifier circuit S/A.

Next, the control circuit 5 performs the first step of the first write operation (steps S16 to S19). The selected memory cells MCs are in an erased state before the first step of the first write operation is performed. For example, as shown in (a) in FIG. 9, the threshold voltage of the selected memory cells MCs exhibits the "eR" distribution.

In step S16, the control circuit 5 performs the first program operation. The control circuit 5 applies an initial set value Vpgm_LM of write voltage to the word line WL which is connected to the selected memory cells MCs (hereinafter referred to as "selected word lines WLs"), and applies an initial set value Vpass_LM of a write pass voltage to non-selected word lines WLns other than the selected word line WL. So-called local self boosting may be also used. Accordingly, there may be a case where the control circuit 5 applies a voltage other than an initial set value Vpass_LM to the non-selected word lines WLns.

When the threshold voltage of the selected memory cells MCs is to be increased (when "0" data is held in the data latch in the sense amplifier circuit S/A), the bit line control circuit 2 sets the voltage of the bit line BL to 0V, for example. As a result, a potential difference between the selected word lines WLs and channels of the selected memory cells MCs is increased and hence, a charge is injected into the charge storage layer FG. When the threshold voltage of the selected memory cells MCs is not to be increased (when "1" data is held in the data latch in the sense amplifier circuit S/A), the bit line control circuit 2 sets a voltage of the bit line BL to 2.5V, for example. As a result, the voltage at the channels of the memory cells MC is increased by so-called self boosting. The potential difference between the selected word lines WLs and the channels of the memory cells MC is decreased so that a charge is hardly injected into the charge storage layer FG.

Next, the control circuit 5 performs a write verify operation (steps S17, S18). In step S17, the control circuit 5 applies a verify voltage VCG_LMV to the selected word lines WLs. With respect to non-selected word lines WLns other than the selected word lines WLs, a read pass voltage Vread which turns on the memory cells MC is applied to the non-selected word lines WLns irrelevant to threshold voltages of the memory cells MCs. The read pass voltage Vread is not limited to the same voltage with respect to all non-selected word lines WLns, and the read pass voltage Vread may differ among non-selected word lines WLns.

The control circuit 5 applies 0V to the common source line CELSRC and applies a precharge voltage to the bit lines BL and, thereafter, turns on the selection transistors SD, SS. When the threshold voltage of the selected memory cells MCs is higher than the verify voltage VCG_LMV, a voltage charged to the bit lines BL is not discharged. The potential of the bit lines BL is detected by the sense amplifier circuit S/A, and it is determined whether the threshold voltage of the selected memory cells MCs is higher or lower than the verify voltage VCG_LMV (step S18).

The control circuit 5 counts the number of selected memory cells MCs whose threshold voltages are written in the "LM" distribution is lower than the verify voltage VCG_LMV. When the number of selected memory cells MCs is smaller than a prescribed value, the control circuit 5 performs the operation in step S20 (LM verify pass: Y in step S18). On the other hand, when the number of selected memory cells MCs is equal to or larger than the prescribed value, the control circuit 5 performs the operation in step S19 (LM verify fail: N in step S18). For example, the prescribed value may be set to 0. The prescribed value may be also set to 1 or more by taking into account the number of defective memory cells MC relieved by an ECC (error correction code).

The control circuit 5 increases a set value of a write voltage by a step-up voltage $\Delta V\_LM$ from an initial set value Vpgm_LM (step S19). The control circuit 5 may also increase a set value of a write pass voltage by a step-up voltage $\Delta V\_P\_LM$ from an initial set value Vpass_LM.

Thereafter, the control circuit 5 again performs the first step of the first program operation (step S16). Then, the control circuit 5 repeats the operation in steps S16 to S19 until an LM verify pass is achieved. When the LM verify pass is not achieved even when the operations in steps S16 to S19 are repeated predetermined number of times, the control circuit 5 may finish the first write operation by determining that writing has failed.

The threshold voltage distribution of the selected memory cells MCs when the LM verify pass is achieved is brought into a state (b) in FIG. 9. For example, when the prescribed value is 0, a lower limit of the "LM" distribution becomes substantially equal to the verify voltage VCG_LMV.

The control circuit 5 performs the second step of the first write operation in steps S20 to S23. In step S20 (first data setting), the control circuit 5 holds "0" data in the data latches in the sense amplifier circuit S/A connected to the selected memory cells MCs whose threshold voltage is written in the "G" distribution, and holds "1" data in the data latches in the sense amplifier circuits S/A connected to the memory cells MCs other than the selected memory cells MCs whose threshold voltage is written in the "G" distribution. For example, when the data held in the data latch BDL is "0" data and data held in the data latches CDL is "0" data, the control circuit 5 sets "0" data in the data latches in the sense amplifier circuits S/A using the arithmetic operation circuit COLC. In other cases, the control circuit 5 sets "1" data in the data latches in the sense amplifier circuits S/A.

There may be a case where data other than "LM" write data is held in the data latch ADL as the result of the write verify operation in the first step. This is because there may be a case where "1" data is sequentially written in the data latches ADL connected to the selected memory cells MCs where the verify pass is achieved. Accordingly, in step S15, "LM" write data is copied to the data latches BDL so that data can be latched to the data latches in the sense amplifier circuits S/A at a high speed.

In step S21, the control circuit 5 performs the (2-1)th step of the first program operation. The control circuit 5 applies an initial set value Vpgm_LMG of a write voltage to the selected word lines WLs, and applies an initial set value Vpass_LM of a write pass voltage to the non-selected word lines WLns other than the selected word line WL. The initial set value Vpgm_LMG is a voltage equal to or larger than the initial set value Vpgm_LM.

In the case of the selected memory cells MCs whose threshold voltages are written in the "G" distribution (when "0" data is held in the data latches in the sense amplifier circuits S/A), the bit line control circuit 2 sets a voltage of the bit lines BL to 0V, for example. As a result, a potential difference between the selected word lines WLs and the channels of the selected memory cells MCs is increased so that a charge is injected into the charge storage layer FG. In the case of the selected memory cells MCs whose threshold voltages are written in the distributions other than the "G" distribution (when "1" data is held in the data latches in the sense amplifier circuits S/A), the bit line control circuit 2 sets a voltage of the bit lines BL to 2.5V, for example. As a result, a voltage of the channels of the memory cells MC is increased by so-called self boosting. A potential difference between the selected word lines WLs and the selected memory cells MCs is decreased so that a charge is hardly injected into the charge storage layer FG.

The control circuit 5 can also change an initial set value Vpgm_LMG between the neighboring word lines WL. For example, an initial set value Vpgm_LMG can be changed between the (2-1)th step of the first write operation on the word line WL0 shown in FIG. 8 and the (2-1)th step of the first write operation on the word line WL1 shown in FIG. 8. For example, at the time of writing random data, data to be written differs for every word line WL. Accordingly, by changing the initial set value Vpgm_LMG corresponding to the number of memory cells MC whose threshold voltages are written in the "LM" distribution, the inter-cell interference can be decreased and hence, widths of the final threshold value distributions shown in FIG. 7 can be narrowed.

In step S22 (second data setting), the control circuit 5 holds "0" data in the data latches in the sense amplifier circuits S/A connected to the selected memory cells MCs whose threshold voltages are written in the "C" distribution, and holds "1" data in the data latches in the sense amplifier circuits S/A connected to the memory cells MCs other than the selected memory cells MCs. For example, when the data held in the data latch BDL is "1" data and data held in the data latch CDL is "0" data, the control circuit 5 sets "0" data in the data latches in the sense amplifier circuits S/A using the arithmetic operation circuit COLC. In other cases, the control circuit 5 sets "1" data in the data latches in the sense amplifier circuits S/A.

There may be a case where data other than "LM" write data is held in the data latch ADL as the result of the write verify operation in the first step. This is because, there may be a case where "1" data is sequentially written in the data latches ADL connected to the selected memory cells MCs where the verify pass is achieved. Accordingly, in step S15, "LM" write data is copied to the data latches BDL so that data can be latched to the data latches in the sense amplifier circuits S/A at a high speed.

In step S23, the control circuit 5 performs the (2-2)th step of the first program operation. The combination of the (2-1)th step of the first program operation and the (2-2)th step of the first program operation may be also referred to as "the second step of the first program operation". The control circuit 5 applies an initial set value Vpgm_LMC of the write voltage to the selected word lines WLs, and applies an initial set value Vpass_LM of a write pass voltage to the non-selected word lines WLns other than the selected word lines WL. Here, the initial set value Vpgm_LMC is a voltage equal to or less than the initial set value Vpgm_LM. That is, the relationship of the initial set value Vpgm_LMC initial set value Vpgm_LM initial set value Vpgm_LMG is established.

In the case of the selected memory cells MCs whose threshold voltages are written in the "C" distribution (when "0" data is held in the data latches in the sense amplifier circuits S/A), the bit line control circuit 2 sets a voltage of the bit lines BL to 0V, for example. As a result, a potential difference between the selected word lines WLs and the channels of the selected memory cells MCs is increased so that a charge is injected into the charge storage layer FG. In the case of the selected memory cells MCs whose threshold voltages are written in the distributions other than the "C" distribution (when "1" data is held in the data latches in the sense amplifier circuits S/A), the bit line control circuit 2 sets a voltage of the bit lines BL to 2.5V, for example. As a result, a voltage of the channels of the memory cells MC is increased by so-called self boosting. A potential difference between the selected word lines WLs and the selected memory cells MCs is decreased so that a charge is hardly injected into the charge storage layer FG.

The control circuit 5 can also change an initial set value Vpgm_LMC between the neighboring word lines WL. For example, an initial set value Vpgm_LMC can be changed between the (2-1)th step of the first write operation on the word line WL0 shown in FIG. 8 and the (2-1)th step of the first write operation on the word line WL1 shown in FIG. 8. For example, at the time of writing random data, data to be written differs for every word line. Accordingly, by changing the initial set value Vpgm_LMC corresponding to the number of memory cells MC held in the "eR" distribution, the inter-cell interference can be decreased and hence, widths of the final threshold value distributions shown in FIG. 7 can be narrowed.

Next, the control circuit 5 performs a finish operation for finishing the first write operation without performing a write verify operation (step S24). In step S24, the control circuit 5 stops the booster circuit 6. As a result, the first write operation is finished.

As a result, the threshold value distributions of the selected memory cells MCs are brought into a state (c) in FIG. 9. The threshold value of the selected memory cells MCs to be written in the "G" distribution exhibits "LM+" distribution, and the threshold value of the selected memory cells MCs to be written in the "C" distribution exhibits "eR+" distribution. An upper portion of the "eR+" distribution and a lower portion of the LM distribution may overlap with each other. This is because the "eR+" distribution and the "LM" distribution can be distinguished from each other based on the transmission of write data having 3 bits from the host computer or the memory controller HM.

In this embodiment, a threshold voltage of the selected memory cells MCs to be written in the "C" distribution is increased after a threshold voltage of the selected memory cells MCs to be written in the "G" distribution is increased. As a result, there is no possibility that the threshold voltage of the selected memory cells MCs to be written in the "C" distribution is increased with a high initial set value Vpgm_LMG. As a result, a width of the threshold value distribution in the "eR+" distribution can be narrowed.

By performing the second step of the first writing after performing the first step of the first writing, a threshold voltage of the selected memory cells MCs to be written in the "G" distribution is increased to the "LM+" distribution through the "LM" distribution. In this case, the inter-cell interference between the neighboring memory cells can be decreased compared to a case where the threshold voltage of the selected memory cells MCs is increased to the "LM+" distribution from the "eR" distribution at a stroke.

A write verify operation is not performed after the second step of the first writing. As a result, the write operation can be performed at a high speed. Further, a width of the threshold value distribution can be adjusted after the second write operation and the operations following the second write operation even when the write verify operation is not applied to the "eR+" distribution and the "LM+" distribution.

In the flowchart shown in FIG. 12, the (2-1)th step and the (2-2)th step of the first program operation are performed only one time respectively. However, the control circuit 5 may perform the (2-1)th step and the (2-2)th step of the first program operation plural times respectively. For example, the control circuit 5 may repeatedly perform the (2-1)th step of the first program operation two times continuously and, thereafter, may perform the second data setting (step S22), and may repeatedly perform the (2-2) th step of the first program operation two times continuously. The control circuit 5 may also step up a write voltage each time the operation is repeated from an initial set value.

(Second Write Operation)

Figure 14:
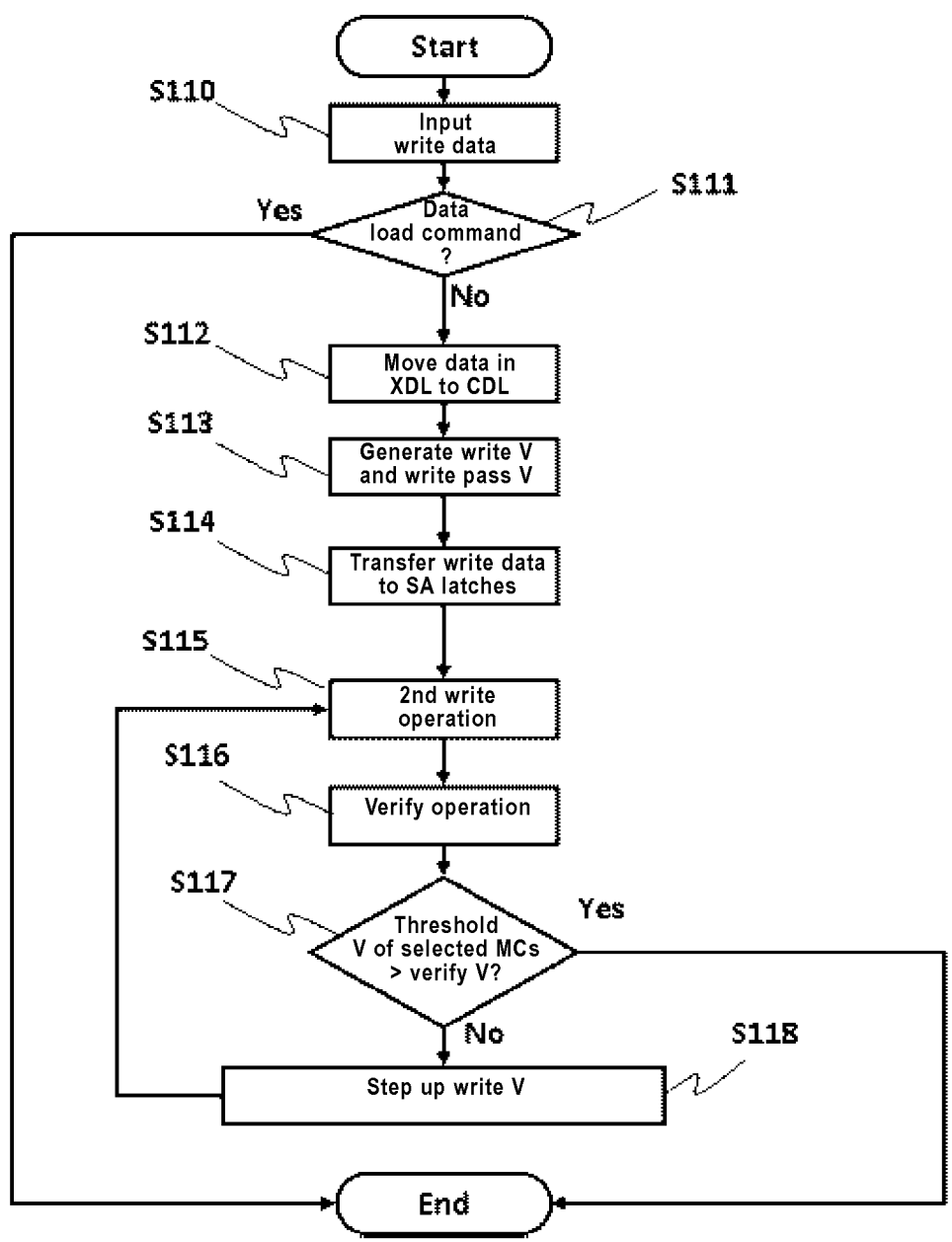
FIG. 14 is a view showing a flowchart of one example of a second write operation

FIG. 14 shows a flowchart of one example of a second write operation. In the same manner as the first write operation, in step S110, write data on the lower page is inputted to the NAND-type flash memory from the host computer or the memory controller HM, and the write data on the lower page is held in the data latch XDL. The control circuit 5 moves the write data on the lower page held in the data latch XDL to the data latch ADL, for example. Next, the write data on the middle page is inputted to the NAND-type flash memory from the host computer or the memory controller HM, and the write data on the middle page is held in the data latch XDL. The control circuit 5 moves the write data on the middle page held in the data latch XDL to the data latch BDL, for example.

Thereafter, write data on the upper page is inputted to the NAND-type flash memory from the host computer or the memory controller HM, and the write data on the upper page is held in the data latch XDL. In step S111, the control circuit 5 confirms whether or not a data load command is transmitted to the NAND-type flash memory from the host computer or the memory controller HM. When the data load command is transmitted to the NAND-type flash memory, the control circuit 5 finishes the write operation. When the data load command is not transmitted to the NAND-type flash memory, the control circuit 5 moves the write data on the upper page held in the data latch XDL to the data latch CDL, for example (step S112).

Next, in step S113, the control circuit 5 activates the booster circuit 6 for generating a write voltage Vpgm and a write pass voltage Vpass.

In step S114, the control circuit 5 converts write data having 3 bits held in the data latches ADL, BDL, CDL to data such that these data correspond to the "eR" distribution to "G" distribution using the arithmetic operation circuit COLC. The control circuit 5 transfers the write data which correspond to the "eR" distribution to the "G" distribution to the data latches arranged in the sense amplifier circuit S/A.

Next, the control circuit 5 performs the second write operation (steps S115 to S118). Before the second write operation is performed, the selected memory cells MCs are in a state (a) in FIG. 10.

In step S115, the control circuit 5 performs the second program operation. The control circuit 5 applies a write voltage Vpgm_2nd to the selected word lines WLs which are connected to the selected memory cells MCs, and applies a write pass voltage Vpass_2nd to the non-selected word lines WLns other than the selected word line WLs. So-called local self boosting may be also used. Accordingly, there may be a case where the control circuit 5 applies a voltage other than an initial set value Vpass to the non-selected word lines WLns.

When the threshold voltage of the selected memory cells MCs is to be increased (when "0" data is held in the data latch in the sense amplifier circuit S/A), the bit line control circuit 2 sets the voltage of the bit lines BL to 0V, for example. As a result, a potential difference between the selected word lines WLs and the channels of the selected memory cells MCs is increased and hence, a charge is injected into the charge storage layer FG. When the threshold voltage of the selected memory cells MCs is not to be increased (when "1" data is held in the data latch in the sense amplifier circuit S/A), the bit line control circuit 2 sets a voltage of the bit lines BL to 2.5V, for example. As a result, the voltage at the channels of the memory cells MC is increased by so-called self boosting. The potential difference between the selected word lines WLs and the channels of the memory cells MC is decreased so that a charge is hardly injected into the charge storage layer FG.

Next, the control circuit 5 performs a write verify operation (steps S116, S117). In step S116, the control circuit 5 applies a verify voltage Vcgrv to the selected word lines WLs. With respect to non-selected word lines WLns, a read pass voltage Vread which turns on the memory cells MC is applied to the non-selected word lines WLns irrelevant to threshold voltage of the memory cell MC. The read pass voltage Vread is not limited to the same voltage with respect to all non-selected word lines WLns, and the read pass voltage Vread may differ among non-selected word lines WLns.

The control circuit 5 applies 0V to the common source line CELSRC, and applies a precharge voltage to the bit line BL and, thereafter, turns on the selection transistors SD, SS. The control circuit 5 changes the verify voltage to VCG_AV1, VCG_BV1 . . . VCG_GV1, and determines whether or not the threshold voltages of the respective selected memory cells MCs reach set values (step S116). For example, in bringing the threshold voltage of the selected memory cells MCs into the distribution, the control circuit 5 determines whether or not a potential of the bit line BL is discharged when the verify voltage VCG_BV1 is applied to the selected word lines WLs.

When the threshold voltage of the selected memory cells MCs reaches the set value, data held in the data latches in the sense amplifier circuit S/A is changed to "1" data.

The control circuit 5 counts the number of "1" data held in the data latch. When the number of "1" data is smaller than a prescribed value, the control circuit 5 finishes the second write operation (verify pass: Y in step S117). On the other hand, when the number of "1" data is equal to or larger than the prescribed value, the control circuit 5 performs the operation in step S117 (verify fail: N in step S117). For example, the prescribed value may be set to 0. The prescribed value may be also set to 1 or more by taking into account the number of defective memory cells MC relieved by an ECC (error correction code).

The control circuit 5 increases a write voltage Vpgm by a step-up voltage ΔV_2nd (step S118). The control circuit 5 may increase a set value of a write pass voltage by the step-up voltage ΔV_P_2nd from an initial set value Vpass_2nd.

Thereafter, the control circuit 5 again performs the second program operation (step S115). Then, the control circuit 5 repeats the operation in steps S115 to S118 until a verify pass is achieved. When the verify pass is not achieved even when the operations in steps S115 to S118 are repeated predetermined times, the control circuit 5 can finish the second write operation by determining that writing fails.

The threshold voltage distributions of the selected memory cells MC when the verify pass is achieved are brought into a state (b) in FIG. 10. For example, when the prescribed value is 0, lower limits of the respective threshold value distributions become substantially equal to verify voltages VCG_AV1, VCG_BV1 . . . VCG_GV1.

In this manner, by performing the second write operation of the selected memory cells MCs after performing the first write operation of the memory cells MC which are connected to the neighboring word line WL, the inter-cell interference can be suppressed. That is, the inter-cell interference between the neighboring memory cells MC caused by the first write operation can be canceled to some extent by performing the second write operation.

During the second write operation, a moving amount of the threshold voltage from the "eR+" distribution to the "C+" distribution is smaller than a moving amount of the threshold voltage from the "eR" distribution to the "C+" distribution. A moving amount of the threshold voltage from the "LM+" distribution to the "G+" distribution is smaller than a moving amount of the threshold voltage from the "LM" distribution to the "C+" distribution. As a result, during the second write operation, the inter-cell interference imparted to the neighboring memory cells MC can be further decreased. For example, the inter-cell interference imparted to the memory cells MC arranged adjacent to the selected memory cell MCs on a source line side where the second write operation is finished can be suppressed. As a result, widths of the threshold value distributions of the memory cells MC can be decreased.

To move the threshold voltage from the "LM" distribution to the "G+" distribution, it is necessary to apply a large write voltage Vpgm to the selected word lines WLs. On the other hand, when the threshold voltage is moved from the "eR" distribution to the "C+" distribution, there may be a case where the write voltage Vpgm can be decreased. That is, when the threshold voltage is moved from the "eR" distribution to the "C+" distribution, there may be a case where the inter-cell interference causes no problem. Accordingly, only the (2-1) th step of the first writing may be performed by omitting the (2-2) th step of the first writing. As a result, the write operation can be performed at a high speed.

After performing the second write operation shown in (b) in FIG. 10, the respective threshold value distributions may overlap with each other. This is because the threshold voltages set in the memory cells MC can be distinguished from each other based on the transmission of write data having 3 bits from the host computer or the memory controller HM.
(Third Write Operation)

Figure 15:
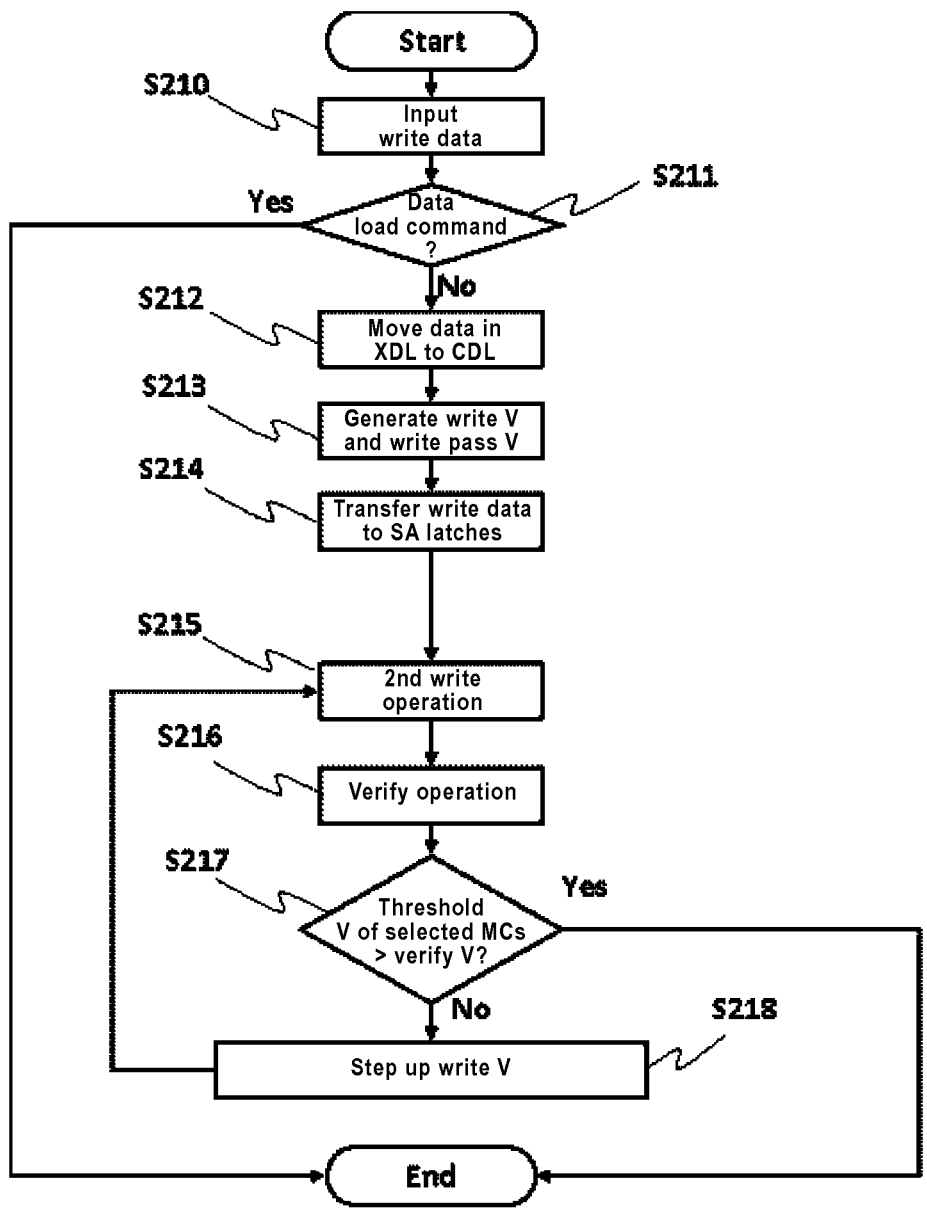
FIG. 15 is a view showing a flowchart of one example of a third write operation.

The control circuit 5 performs a third write operation after the second write operation is finished. FIG. 15 shows a flowchart of one example of the third write operation. The flow of the third write operation is substantially the same as the flow of the second write operation. The explanation of steps in the third write operation which are substantially the same the corresponding steps in the second write operation is omitted.

Steps S210 to 218 of the third write operation correspond to steps S110 to step S118 of the second write operation. A point which makes the third write operation differ from the second write operation lies in values of verify voltages used in step S216. Due to the difference in values of the verify voltages, as a write voltage and a write pass voltage in step S215, a write voltage Vpgm__3rd and a write pass voltage Vpass__3rd which have values different from the write voltage and the write pass voltage of the second write operation are used. Also as step-up voltages in step S218, step-up voltages ΔV__3rd and ΔV_P__3rd which have values different from values of the corresponding step-up voltages of the second write operation are used. The write voltage Vpgm__3rd, a write pass voltage Vpass__3rd, and the step-up voltages ΔV__3rd, ΔV_P__3rd may be set to values equal to the write voltage Vpgm__2nd, the write pass voltage Vpass__2nd and the step-up voltages ΔV__2nd, ΔV_P__2nd, respectively.

During the third write operation, the control circuit changes the verify voltage to VCG_AV2, VCG_BV2 . . . VCG_GV2, and determines whether or not the threshold voltages of the respective selected memory cells MCs reach set values. For example, in bringing the threshold voltage of the selected memory cells MCs into the "B" distribution, the control circuit 5 determines whether or not a potential of the bit line BL is discharged when the verify voltage VCG_BV2 is applied to the selected word lines WLs (step S215).

The verify voltages VCG_AV2, VCG_BV2 . . . VCG_GV2 are voltages higher than the verify voltages VCG_AV1, VCG_BV1 . . . VCG_GV1. That is, the threshold value distributions are roughly formed at the first target verify voltages lower than the second target verify voltages and, then, the threshold value distributions are accurately formed at the second target verify voltages.

The selected memory cells MCs are in a state (a) in FIG. 11 before the third write operation is performed. The threshold voltage distributions of the selected memory cells MC when the verify pass is achieved are brought into a state (b) in FIG. 11. For example, when the prescribed value is 0, lower limits of the respective threshold value distributions become substantially equal to the verify voltages VCG_AV2, VCG_BV2 . . . VCG_GV2 respectively.

Moving amounts of the threshold voltages of the selected memory cells MCs during the second write operation are relatively large. Accordingly, due to the second write operation, the threshold value distribution of the neighboring memory cells MC is changed by the inter-cell interference. In view of the above, the control circuit 5 applies the third write operation to the selected memory cells MCs connected to the selected word line WLs after the second write operation applied to the memory cells MC connected to the word lines arranged adjacent to the selected word lines WLs on a drain side is finished. As a result, a change of threshold value distribution caused by the inter-cell interference between the memory cells MC can be suppressed. That is, the inter-cell interference caused by the second write operation of the neighboring memory cell MC can be cancelled to some extent by performing the third write operation.

During the second write operation, moving amounts of threshold voltages of the memory cells MC whose threshold voltages are written in the "C+" distribution and the "G+" distribution can be decreased. That is, by performing the second step of the first write operation, the inter-cell interference given by the neighboring memory cells MC during the second write operation can be decreased. As described previously, the inter-cell interference caused by the first write operation is cancelled by the second write operation. That is, to observe these write operations as a whole, the inter-cell interference imparted to the selected word line WLs from the word line WL arranged adjacent to the selected word line WLs on a drain side can be decreased. As a result, widths of the threshold value distributions after the third write operation which is the final threshold value distribution can be narrowed.

Further, the inter-cell interference imparted to the neighboring memory cell MC during the second write operation is small and hence, the third write operation may be omitted as needed.
(Write Operation According to Second Embodiment)

Figure 16:
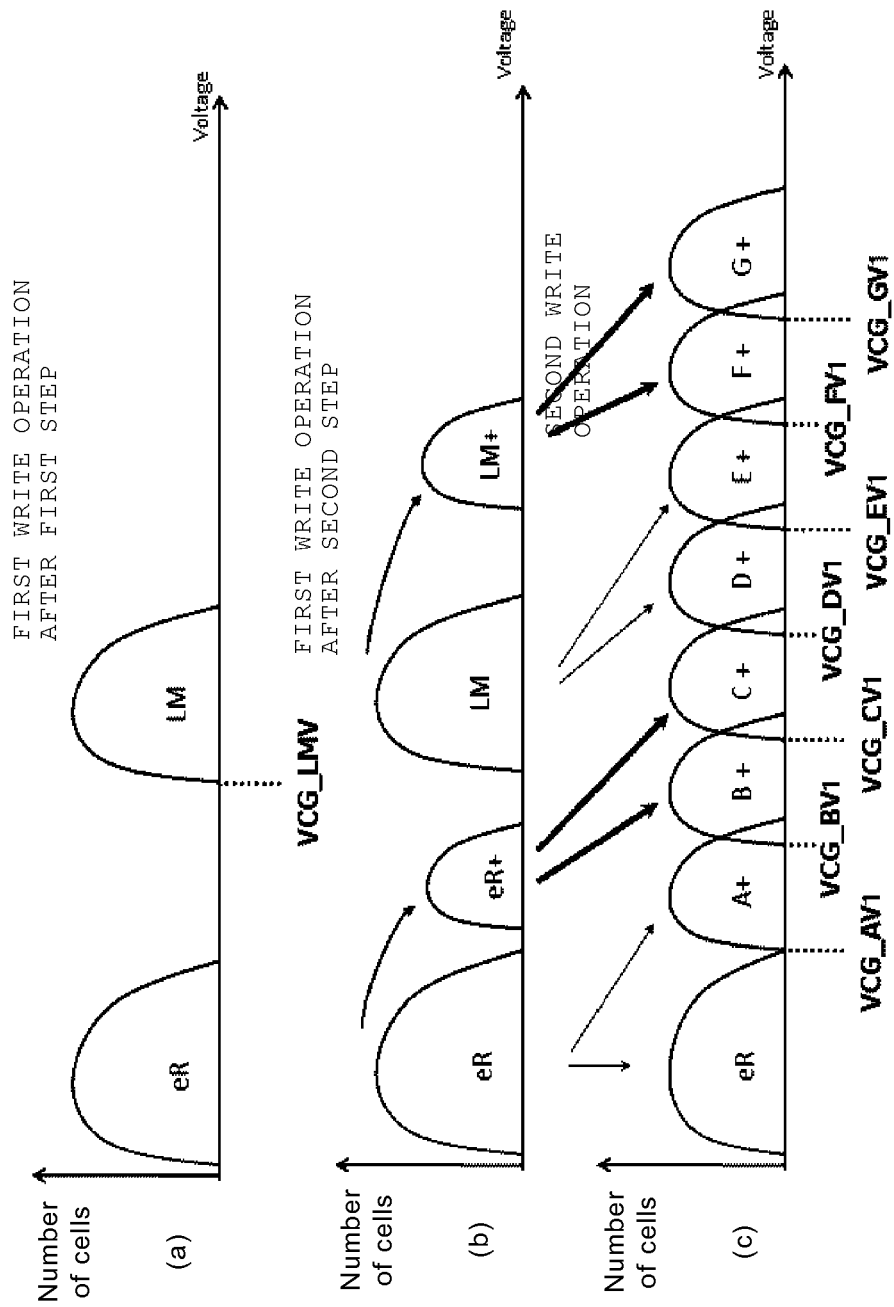
FIG. 16 is a view showing one example of a transition of the threshold value distribution of memory cells during a write operation according to a second embodiment.

The write operation according to the second embodiment is explained in conjunction with FIG. 16. FIG. 16 shows one example of the transition of the threshold value distributions of memory cells MC during the write operation according to the second embodiment. The explanation of steps in the write operation according to the second embodiment which are substantially the same as the corresponding steps in the write operation according to the first embodiment is omitted.

The write operation according to the second embodiment differs from the write operation according to the first embodiment with respect to setting of the threshold value distributions in the second step of the first write operation. The flow of the first to third write operations in the second embodiment is the same as the first to third write operations in the first embodiment and hence, the explanation of the flow of the first to third write operations in the second embodiment is omitted.

As shown in (b) and (c) in FIG. 16, during the first write operation, the control circuit 5 moves the threshold values of the selected memory cells MCs to be written in the "G" distribution and the "F" distribution from the "LM" distribution to the "LM+" distribution. The control circuit 5 moves the threshold values of the selected memory cells MCs to be written in the "C" distribution and the "B" distribution from the "eR" distribution to the "eR+" distribution.

For example, in step S15, the control circuit 5 holds "0" data in the data latch CDL when the control circuit 5 moves the threshold voltages of the selected memory cells MC to the "B" distribution, the "C" distribution, the "F" distribution and "G" distribution in the "eR" distribution, the "A" distribution, the "B" distribution, the "C" distribution, the "D" distribution, the "E" distribution, the "F" distribution and "G" distribution using the arithmetic operation circuit COLC. The control circuit 5 holds "1" data in the data latch CDL when the control circuit 5 moves the threshold voltage of the selected memory cell MC to other distributions using the arithmetic operation circuit COLC.

In step S20, for example, when the data held in the data latch BDL is "0" data and data held in the data latch CDL is "0" data, the control circuit 5 sets "0" data in the data latches in the sense amplifier circuits S/A using the arithmetic operation circuit COLC. In other cases, the control circuit 5 sets "1" data in the data latches in the sense amplifier circuit S/A.

In the (2-1)th step of the first program operation in step S21 performed by the control circuit 5, in the case of the selected memory cells MCs whose threshold voltages are written in the "F" distribution and the "G" distribution (when "0" data is held in the data latches in the sense amplifier circuit S/A), the bit line control circuit 2 sets the voltage of the bit lines BL to 0V, for example. In the case of the selected memory cells MCs whose threshold voltages are written in the distributions other than the "F" distribution and the "G" distribution (when "1" data is held in the data latches in the sense amplifier circuit S/A), the bit line control circuit 2 sets the voltage of the bit lines BL to 2.5V, for example. The control circuit 5 does not perform the write verify operation after the (2-1)th step of the first program operation.

In step S22 (second data setting), for example, when data held in the data latch BDL is "1" data and data held in the data latch CDL is "0" data, the control circuit 5 sets "0" data in the data latches in the sense amplifier circuit S/A using the arithmetic operation circuit COLC. In other cases, the control circuit 5 sets "1" data in the data latches in the sense amplifier circuit S/A.

In the (2-2)th step of the first program operation in step S23 performed by the control circuit 5, in the case of the selected memory cells MCs whose threshold voltages are written in the "B" distribution and the "C" distribution (when "0" data is held in the data latches in the sense amplifier circuit S/A), the bit line control circuit 2 sets the voltage of the bit lines BL to 0V, for example. In the case of the selected memory cells MCs whose threshold voltages are written in the distributions other than the "B" distribution and the "C" distribution (when "1" data is held in the data latches in the sense amplifier circuit S/A), the bit line control circuit 2 sets the voltage of the bit lines BL to 2.5V, for example. The control circuit 5 does not perform the write verify operation after the (2-2)th step of the first program operation.

As a result, the threshold value distributions of the selected memory cells MCs are brought into a state (b) in FIG. 16. The threshold values of the selected memory cells MCs to be written in the "F" distribution and the "G" distribution exhibit "LM+" distribution, and the threshold values of the selected memory cells MCs to be written in the "B" distribution and the "C" distribution exhibit "eR+" distribution.

Thereafter, the control circuit 5 performs the second write operation from steps S114 to step S117. The threshold voltage distributions of the selected memory cells MC when the verify pass is achieved in step S116 are brought into a state (b) in FIG. 16.

In this manner, the write operation of the second embodiment can also acquire the substantially same advantageous effect as the write operation of the first embodiment. Further, during the write operation of the second embodiment, not only the threshold voltage of the selected memory cells MCs to be written in the "G" distribution, but also the threshold voltage of the selected memory cells MCs to be written in the "F" distribution is also increased. Further, not only the threshold voltage of the selected memory cells MCs to be written in the "C" distribution, but also the threshold voltage of the selected memory cells MCs to be written in the "B" distribution is also increased.

During the second write operation, a moving amount of the threshold voltage from the "eR+" distribution to the "B+" distribution is smaller than a moving amount of the threshold voltage from the "eR" distribution to the "B" distribution. A moving amount of the threshold voltage from the "LM+" distribution to the "F+" distribution is smaller than a moving amount of the threshold voltage from the "LM" distribution to the "F+" distribution. In this manner, not only in the distribution where a moving amount of the threshold voltage is the largest but also in the distribution where a moving amount of the threshold voltage is the second largest, the threshold voltage is moved during the first write operation. As a result, the inter-cell interference imparted to the neighboring memory cells MC during the second write operation can be further decreased. For example, the inter-cell interference imparted to the memory cells MC arranged adjacent to the selected memory cells MCs on a source line side where the second write operation is finished can be suppressed. As a result, widths of the threshold value distributions of the memory cells MC can be decreased, and the write operation can be performed at high speed.

Further, the control circuit 5 can move the threshold voltage of the memory cell MC to be written in the "C" to "G" distributions to the "LM" distribution in the first step of the first write operation. The control circuit 5 also can move the threshold voltage of the memory cell MC to be written in the "F" distribution and the "G" distribution to the "LM+" distribution in the first step of the first write operation. In this manner, the technical concept of the exemplary embodiments includes all operations where the threshold voltages of the memory cell MC are moved to higher values from the "LM" distribution or the "eR" distribution after the first step of the first write operation is finished and before the second write operation is started.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a memory cell array including a plurality of memory strings each of which includes a series a plurality of memory cells that are each capable of storing data having n bits (where n is an integer of 3 or more);
word lines, each connected in common to memory cells of different memory strings;
bit lines, each connected to a first end of one of the memory strings;
a source line connected to second ends of the memory strings;
a sense amplifier circuit connected to the bit lines;
a plurality of latch circuits connected to the sense amplifier circuit; and
a control circuit which controls a first write operation and a second write operation, wherein
the first write operation includes a first step where a middle threshold voltage distribution above an erased state is formed in memory cells that are commonly connected to selected word lines and a second step following the first step where threshold voltages of some of the memory cells are increased, and the second write operation includes a step where threshold voltage distributions which correspond to the data having n bits is formed in the memory cells, and
the control circuit is configured to perform a write verify operation after the first step but not after the second step.

2. The semiconductor memory device according to claim 1, wherein the control circuit is configured to perform a third write operation after the second write operation to improve separation of the threshold voltage distributions.

3. The semiconductor memory device according to claim 2, wherein
a write verify operation is performed at a first target verify voltage during the second write operation, and a write verify operation is performed at a second target verify voltage higher than the first target verify voltage during the third write operation.

4. The semiconductor memory device according to claim 3, wherein
the word lines include a first word line and a second word line adjacent to the first word line, and the control circuit is configured to perform the first write operation with respect to a first memory cell connected to the first word line and then with respect to a second memory cell connected to the second word line and, thereafter, to perform the second write operation with respect to the first memory cell.

5. The semiconductor memory device according to claim 3, wherein
the word lines include a first word line, a second word line adjacent to the first word line, and a third word line adjacent to the second word line, and the control circuit is configured to perform the first write operation with respect to a first memory cell connected to the first word line and then with respect to a second memory cell connected to the second word line and, thereafter, to perform the second write operation with respect to the first memory cell and, thereafter, to perform the first write operation with respect to a third memory cell connected to the third word line and, thereafter, to perform the second write operation with respect to the second memory cell and, thereafter, to perform the third write operation with respect to the first memory cell.

6. The semiconductor memory device according to claim 5, wherein
during the first write operation, a portion of the memory cells are upper memory cells which are written to have a threshold voltage distribution higher than the middle threshold voltage distribution and a portion of the memory cells are lower memory cells which are written to have a threshold voltage distribution higher than an erased state and lower than the middle threshold voltage distribution.

7. The semiconductor memory device according to claim 6, wherein
the control circuit is configured to perform writing of data in the lower memory cells by applying a first write voltage to the first word line, and performs writing of data in the upper memory cells by applying a second write voltage higher than the first write voltage to the first word line.

8. The semiconductor memory device according to claim 1, wherein a portion of the memory cells are upper memory cells which are written to have a threshold voltage distribution higher than the middle threshold voltage distribution and a portion of the memory cells are lower memory cells which are written to have a threshold voltage distribution higher than an erased state and lower than the middle threshold voltage distribution.

9. The semiconductor memory device according to claim 8, wherein
during the second write operation, a number of different levels of program voltages are applied to the memory cells to change the threshold voltage distribution, a first program voltage being applied to the upper memory cells and a second program voltage, which is lower than the first program voltage, being applied to the lower memory cells.

10. The semiconductor memory device according to claim 8, wherein
during the second write operation, a number of different levels of program voltages are applied to the memory cells to change the threshold voltage distribution, a first program voltage and a second program voltage, which is lower than the first program voltage, being applied to the upper memory cells, and a third program voltage, which is lower than the second program voltage, and a fourth program voltage, which is lower than the third program voltage, being applied to the lower memory cells.

11. A nonvolatile semiconductor memory device comprising:
a memory cell array including a plurality of memory strings each of which includes a series a plurality of memory cells that are each capable of storing data having n bits (where n is an integer of 3 or more);
word lines, each connected in common to memory cells of different memory strings; and
a control circuit which controls a first write operation and a second write operation, wherein
the first write operation includes a first step where a middle threshold voltage distribution above an erased state is formed in memory cells that are commonly connected to selected word lines and a second step following the first step where threshold voltages of some of the memory cells are increased, and the second write operation includes a step where threshold voltage distributions which correspond to the data having n bits is formed in the memory cells, and
the control circuit is configured to perform a write verify operation after the first step but not after the second step.

12. The semiconductor memory device according to claim 11, wherein the control circuit is configured to perform a third write operation after the second write operation to improve separation of the threshold voltage distributions.

13. The semiconductor memory device according to claim 11, wherein a portion of the memory cells are upper memory cells which are written to have a threshold voltage distribution higher than the middle threshold voltage distribution and a portion of the memory cells are lower memory cells which are written to have a threshold voltage distribution higher than an erased state and lower than the middle threshold voltage distribution.

14. The semiconductor memory device according to claim 13, wherein
during the second write operation, a number of different levels of program voltages are applied to the memory cells to change the threshold voltage distribution, a first program voltage being applied to the upper memory cells and a second program voltage, which is lower than the first program voltage, being applied to the lower memory cells.

15. The semiconductor memory device according to claim 13, wherein
during the second write operation, a number of different levels of program voltages are applied to the memory cells to change the threshold voltage distribution, a first program voltage and a second program voltage, which is lower than the first program voltage, being applied to the upper memory cells, and a third program voltage, which is lower than the second program voltage, and a fourth highest program voltage, which is lower than the third program voltage, being applied to the lower memory cells.

16. A method of writing data in memory cells of a nonvolatile semiconductor memory device having a memory cell array including a plurality of memory strings each of which includes a series a plurality of memory cells that are each capable of storing data having n bits (where n is an integer of 3 or more), word lines, each connected in common to memory cells of different memory strings, and a control circuit which controls a first write operation and a second write operation, said method comprising:
performing a first step of the first write operation to form a middle threshold voltage distribution above an erased state in memory cells that are commonly connected to selected word lines;
following the first step, performing a second step of the first write operation to increase threshold voltages of some of the memory cells; and
performing the second write operation to form threshold voltage distributions which correspond to the data having n bits is formed in the memory cells, wherein
a write verify operation is performed after the first step but not after the second step.

17. The method according to claim 16, further comprising:
performing a third write operation after the second write operation to improve separation of the threshold voltage distributions.

18. The method according to claim 16, wherein a portion of the memory cells are upper memory cells which are written to have a threshold voltage distribution higher than the middle threshold voltage distribution and a portion of the memory cells are lower memory cells which are written to have a threshold voltage distribution higher than an erased state and lower than the middle threshold voltage distribution.

19. The method according to claim 18, wherein
during the second write operation, a number of different levels of program voltages are applied to the memory cells to change the threshold voltage distribution, a first program voltage being applied to the upper memory cells and a second program voltage, which is lower than the first program voltage, being applied to the lower memory cells.

20. The method according to claim 18, wherein
during the second write operation, a number of different levels of program voltages are applied to the memory cells to change the threshold voltage distribution, a first program voltage and a second program voltage, which is lower than the first program voltage, being applied to the upper memory cells, and a third program voltage, which is lower than the second program voltage, and a fourth program voltage, which is lower than the third program voltage, being applied to the lower memory cells.

* * * * *